US010257018B2

(12) United States Patent
Zhang et al.

(10) Patent No.: US 10,257,018 B2
(45) Date of Patent: Apr. 9, 2019

(54) FAILURE ANALYSIS METHOD AND DEVICE

(71) Applicant: Huawei Technologies Co., Ltd., Shenzhen (CN)

(72) Inventors: Xiaolong Zhang, Wuhan (CN); Jie Lv, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 153 days.

(21) Appl. No.: 15/429,491

(22) Filed: Feb. 10, 2017

(65) Prior Publication Data
US 2017/0155541 A1 Jun. 1, 2017

Related U.S. Application Data

(63) Continuation of application No. PCT/CN2014/084252, filed on Aug. 13, 2014.

(51) Int. Cl.
H04B 3/48 (2015.01)
H04L 12/24 (2006.01)
G01R 31/08 (2006.01)
G01R 23/16 (2006.01)
H04L 12/28 (2006.01)
(Continued)

(52) U.S. Cl.
CPC .......... *H04L 41/0631* (2013.01); *G01R 23/16* (2013.01); *G01R 31/08* (2013.01); *G01R 31/088* (2013.01); *H04B 3/48* (2013.01); *H04B 10/079* (2013.01); *H04B 10/25751* (2013.01); *H04L 12/2801* (2013.01); *H04L 41/0677* (2013.01)

(58) Field of Classification Search
CPC .................................................. H04L 41/0631

USPC ......................................................... 370/216
See application file for complete search history.

(56) References Cited

U.S. PATENT DOCUMENTS

2004/0073664 A1* 4/2004 Bestermann ............ H04L 43/00
                                                    709/224
2007/0230555 A1* 10/2007 Peleg ....................... H04B 3/48
                                                    375/232
(Continued)

FOREIGN PATENT DOCUMENTS

CN      101308180 A      11/2008
CN      101309152 A      11/2008
(Continued)

OTHER PUBLICATIONS

"Physical Layer Specification," CM-SP-PHYv3.0-I11-130808, DOCSIS 3.0, Aug. 8, 2013, 200 pages.
(Continued)

*Primary Examiner* — Shripal K Khajuria
(74) *Attorney, Agent, or Firm* — Conley Rose, P.C.

(57) ABSTRACT

A failure analysis method and device, where the method includes obtaining a frequency domain response amplitude of a channel from a hybrid fiber-coaxial (HFC) network, performing linear fitting on an effective portion of the frequency domain response amplitude to determine a channel slope value, and performing channel failure analysis according to the channel slope value. Failure analysis is performed according to the obtained channel slope value, and the channel slope value is a new failure analysis parameter. In this way, means of channel failure analysis increase, and channel failure analysis is more accurate.

20 Claims, 14 Drawing Sheets

(51) Int. Cl.
*H04B 10/079* (2013.01)
*H04B 10/2575* (2013.01)

(56) References Cited

U.S. PATENT DOCUMENTS

| | | | | |
|---|---|---|---|---|
| 2008/0288189 | A1* | 11/2008 | Rao | H02H 1/0015 |
| | | | | 702/59 |
| 2013/0182753 | A1* | 7/2013 | Delforce | H04B 17/0085 |
| | | | | 375/228 |

FOREIGN PATENT DOCUMENTS

| | | |
|---|---|---|
| CN | 102175917 A | 9/2011 |
| CN | 103119845 A | 5/2013 |
| CN | 103969554 A | 8/2014 |
| EP | 1993181 A2 | 11/2008 |
| WO | 2012009757 A1 | 1/2012 |

OTHER PUBLICATIONS

"Proactive Network Maintenance Using Pre-equalization," XP55370468, CM-GL-PNMP-V02-110623, DOCSIS, Jun. 23, 2011, 133 pages.
Hranac, R., "Understanding and Troubleshooting Linear Distortions: Micro-reflections, Amplitude Ripple/Tilt and Group Delay," XP55370845, Cisco Systems, Dec. 31, 2005, 15 pages.
Foreign Communication From a Counterpart Application, European Application No. 14899608.5, Extended European Search Report dated May 17, 2017, 7 pages.
Foreign Communication From a Counterpart Application, PCT Application No. PCT/CN2014/084252, English Translation of International Search Report dated May 12, 2015, 2 pages.
Foreign Communication From a Counterpart Application, PCT Application No. PCT/CN2014/084252, English Translation of Written Opinion dated May 12, 2015, 5 pages.
Machine Translation and Abstract of Chinese Publication No. CN101309152, Nov. 19, 2008, 28 pages.
Foreign Communication From a Counterpart Application, Chinese Application No. 201480007230.9, Chinese Office Action dated Mar. 23, 2018, 6 pages.

* cited by examiner

FAILURE ANALYSIS METHOD AND DEVICE

CROSS-REFERENCE TO RELATED APPLICATIONS

This application is a continuation of International Patent Application No. PCT/CN2014/084252 filed on Aug. 13, 2014, which is hereby incorporated by reference in its entirety.

TECHNICAL FIELD

The present disclosure relates to the field of communications technologies, and in particular, to a failure analysis method and device.

BACKGROUND

A hybrid fiber-coaxial (HFC) network generally consists of three parts, a fiber backbone, a coaxial branch cable, and a user distribution network. A program signal from a cable television station is first converted into an optical signal for transmission over a fiber backbone. The optical signal is converted into an electrical signal in a user area, and the electrical signal is transmitted to users over a coaxial cable after being distributed by a distributor.

A typical HFC network includes devices such as a cable modem termination system (CMTS), a cable modem (CM), and an optical station, components (an amplifier, an attenuator, a splitter, and a distributor), an optical cable (fiber), a coaxial cable, and the like. A problem may occur on any device or component, or any section of cable on the HFC network. Therefore, an uplink signal on the HFC network is subject to various linear distortions such as a group delay and micro-reflection.

Data Over Cable Service Interface Specification (DOCSIS) 3.0 defines a pre-equalizer, where each CM has a pre-equalizer inside such that reverse compensation can be obtained for a signal before the CM transmits the signal. The pre-equalizer defined in DOCSIS 3.0 is a linear filter with 24 tap coefficients, where the 24 coefficients are referred to as pre-equalization coefficients. In a processing structure of the pre-equalizer, a delay of each tap coefficient is one symbol, and each of the tap coefficients has a different amplitude.

The pre-equalizer can temporarily relieve a distortion on a line in terms of data processing, but the fault (for example, cable impairment) still exists in the line. User service experience is affected when the fault becomes serious to some extent. Therefore, it is quite necessary to perform network operation and maintenance on a fault (especially a small fault) that occurs on a line.

Conventional network operation and maintenance is triggered in response to user complaints and is passive. Therefore, to better handle, locate, and troubleshoot a fault, proactive network maintenance (PNM) needs to be performed. It can be learnt from the foregoing that, a pre-equalizer is used to compensate for a distortion on a cable line, and a frequency domain response of the pre-equalizer is reversely complementary to a channel response of the line. Therefore, pre-equalization coefficients include line fault information. The pre-equalization coefficients may be used for analysis in order to discover a fault on a cable network in advance and locate the fault. This method for failure diagnosis by monitoring pre-equalization coefficients of each CM is referred to as PNM using Pre-equalization (PNMP).

In PNMP, algorithm analysis is performed according to pre-equalization coefficients. For example, parameters such as time domain tap coefficients and a frequency domain response may be obtained according to pre-equalization coefficients, for failure analysis. However, a means of performing failure analysis according to pre-equalization coefficients is relatively single. As a result, parameters obtained by means of calculation cannot reflect an actual status of a physical line accurately and thoroughly, which causes inaccurate failure analysis.

SUMMARY

Embodiments of the present disclosure provide a failure analysis method and device such that means of channel failure analysis increase, and channel failure analysis is more accurate.

A first aspect of the embodiments of the present disclosure provides a failure analysis method, including obtaining a frequency domain response amplitude of a channel from an HFC network, performing linear fitting on an effective portion of the frequency domain response amplitude to determine a channel slope value, and performing channel failure analysis according to the channel slope value.

With reference to the first aspect of the embodiments of the present disclosure, in a first implementation manner of the first aspect of the embodiments of the present disclosure, obtaining a frequency domain response amplitude from an HFC network includes obtaining time domain tap coefficients according to pre-equalization coefficients obtained from an HFC network device, performing time-to-frequency conversion on the time domain tap coefficients to obtain a frequency domain response, and obtaining the frequency domain response amplitude according to the frequency domain response.

With reference to the first aspect or the first implementation manner of the first aspect of the embodiments of the present disclosure, in a second implementation manner of the first aspect of the embodiments of the present disclosure, performing channel failure analysis according to the channel slope value includes analyzing channel quality according to the channel slope value, where the channel slope value is inversely proportional to the channel quality.

With reference to the first aspect or the first implementation manner of the first aspect of the embodiments of the present disclosure, in a third implementation manner of the first aspect of the embodiments of the present disclosure, performing linear fitting on an effective portion of the frequency domain response amplitude to determine a channel slope value includes querying, according to the effective portion of the frequency domain response amplitude, a target straight line ($Y=kX+b$) that is most similar to an amplitude curve for the effective portion of the frequency domain response amplitude and that has a smallest mean squared error value ($\Sigma(FmagB-Y)^2$), where FmagB is the effective portion of the frequency domain response amplitude, and determining that the channel slope value is k.

With reference to the third implementation manner of the first aspect of the embodiments of the present disclosure, in a fourth implementation manner of the first aspect of the embodiments of the present disclosure, after performing linear fitting on an effective portion of the frequency domain response amplitude, the method further includes determining that a fitting amplitude is Y, subtracting the fitting amplitude from the frequency domain response amplitude to obtain a corrected effective amplitude, performing interpolation on an amplitude other than the corrected effective amplitude according to the corrected effective amplitude, to obtain a corrected frequency domain response amplitude, and performing channel failure analysis according to the corrected frequency domain response amplitude.

With reference to the fourth implementation manner of the first aspect of the embodiments of the present disclosure, in a fifth implementation manner of the first aspect of the embodiments of the present disclosure, performing failure analysis according to the corrected frequency domain response amplitude includes obtaining a frequency difference ($\Delta f$) between two consecutive amplitude extreme points in a frequency domain response amplitude curve according to the corrected frequency domain response amplitude, where the two amplitude extreme points are two amplitude maximum points or two amplitude minimum points, calculating a micro-reflection delay ($\Delta t$) according to $\Delta t=1/\Delta f$, and calculating a distance (TDR=$\Delta t*v/2$) between two fault sources according to $\Delta t$ and a signal transmission speed v.

With reference to the fourth implementation manner of the first aspect of the embodiments of the present disclosure, in a sixth implementation manner of the first aspect of the embodiments of the present disclosure, the method further includes obtaining a frequency domain response phase according to the frequency domain response, obtaining a corrected frequency domain response according to the corrected frequency domain response amplitude and the frequency domain response phase, performing frequency-to-time conversion on the corrected frequency domain response to obtain corrected time domain tap coefficients, and performing channel failure analysis according to the corrected time domain tap coefficients.

A second aspect of the embodiments of the present disclosure provides a failure analysis device, including a first obtaining unit configured to obtain a frequency domain response amplitude of a channel from an HFC network, a first determining unit configured to perform linear fitting on an effective portion of the frequency domain response amplitude to determine a channel slope value, and a first failure analysis unit configured to perform channel failure analysis according to the channel slope value.

With reference to the second aspect, in a first possible implementation manner, the first obtaining unit includes a first obtaining module configured to obtain time domain tap coefficients according to pre-equalization coefficients obtained from an HFC network device, a second obtaining module configured to perform time-to-frequency conversion on the time domain tap coefficients to obtain a frequency domain response, and a third obtaining module configured to obtain the frequency domain response amplitude according to the frequency domain response.

With reference to the second aspect or the first implementation manner of the second aspect, in a second implementation manner of the second aspect of the embodiments of the present disclosure, the first failure analysis unit includes a failure analysis module configured to analyze channel quality according to the channel slope value, where the channel slope value is inversely proportional to the channel quality.

With reference to the second aspect or the first implementation manner of the second aspect, in a third implementation manner of the second aspect of the embodiments of the present disclosure, the first determining unit includes a query module configured to query, according to the effective portion of the frequency domain response amplitude, a target straight line (Y=kX+b) that is most similar to an amplitude curve for the effective portion of the frequency domain response amplitude and that has a smallest mean squared error value ($\Sigma(FmagB-Y)^2$), where FmagB is the effective portion of the frequency domain response amplitude, and a first determining module configured to determine that the channel slope value is k.

With reference to the third implementation manner of the second aspect, in a fourth implementation manner of the second aspect of the embodiments of the present disclosure, the first determining unit further includes a second determining module configured to determine that a fitting amplitude is Y, and the device further includes a second obtaining unit configured to subtract the fitting amplitude from the frequency domain response amplitude to obtain a corrected effective amplitude, a third obtaining unit configured to perform interpolation on an amplitude other than the corrected effective amplitude according to the corrected effective amplitude, to obtain a corrected frequency domain response amplitude, and a second failure analysis unit configured to perform channel failure analysis according to the corrected frequency domain response amplitude.

With reference to the fourth implementation manner of the second aspect, in a fifth implementation manner of the second aspect of the embodiments of the present disclosure, the second failure analysis unit further includes an obtaining module configured to obtain a $\Delta f$ between two consecutive amplitude extreme points in a frequency domain response amplitude curve according to the corrected frequency domain response amplitude, where the two amplitude extreme points are two amplitude maximum points or two amplitude minimum points, a first calculation module configured to calculate a $\Delta t$ according to $\Delta t=1/\Delta f$, and a second calculation module configured to calculate a TDR=$\Delta t*v/2$ between two fault sources according to $\Delta t$ and a v.

With reference to the fourth implementation manner of the second aspect, in a sixth implementation manner of the second aspect of the embodiments of the present disclosure, the device further includes a fourth obtaining unit configured to obtain a frequency domain response phase according to the frequency domain response, a fifth obtaining unit configured to obtain a corrected frequency domain response according to the corrected frequency domain response amplitude and the frequency domain response phase, a sixth obtaining unit configured to perform frequency-to-time conversion on the corrected frequency domain response to obtain corrected time domain tap coefficients, and a third failure analysis unit configured to perform channel failure analysis according to the corrected time domain tap coefficients.

It can be learnt from the foregoing technical solutions that, the embodiments of the present disclosure have the following advantages.

Failure analysis is performed according to an obtained channel slope value, and the channel slope value is a new failure analysis parameter. In this way, means of channel failure analysis increase, and channel failure analysis is more accurate.

DESCRIPTION OF EMBODIMENTS

Embodiments of the present disclosure provide a failure analysis method and device such that means of channel failure analysis increase, channel failure analysis is more accurate.

To make persons skilled in the art understand the technical solutions in the present disclosure better, the following clearly describes the technical solutions in the embodiments of the present disclosure with reference to the accompanying drawings in the embodiments of the present disclosure.

In the specification, claims, and accompanying drawings of the present disclosure, the terms "first," "second," and the like (if exist) are intended to distinguish between similar objects but do not necessarily indicate a specific order or sequence. It should be understood that terms used in such a way are interchangeable in proper circumstances so that the embodiments described herein can be implemented in other orders than the order illustrated or described herein. Moreover, the terms "include," "contain" and any other variants mean to cover the non-exclusive inclusion, for example, a process, method, system, product, or device that includes a list of steps or units is not necessarily limited to those units, but may include other units not expressly listed or inherent to such a process, method, system, product, or device.

Figure 1:
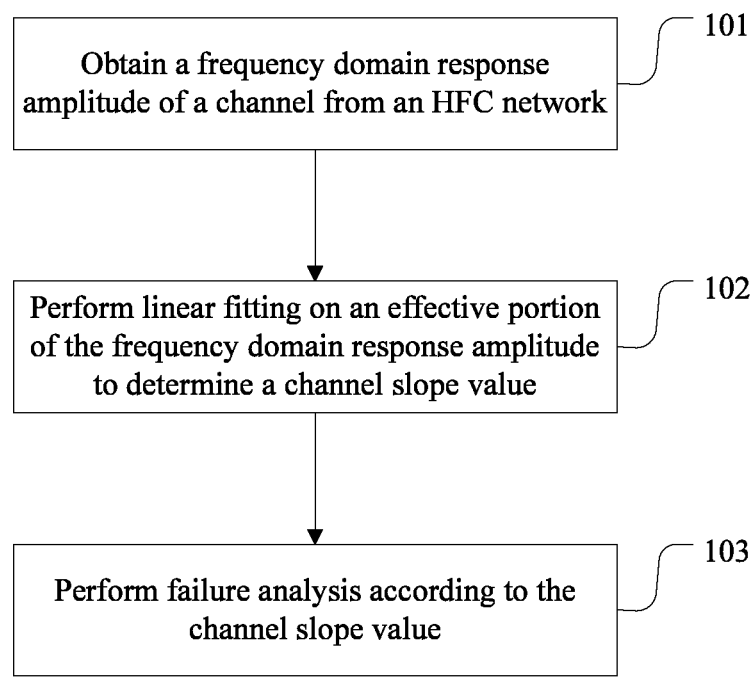
FIG. 1 is a schematic flowchart diagram of an embodiment of a failure analysis method according to embodiments of the present disclosure.

Referring to FIG. 1, an embodiment of a failure analysis method in the embodiments of the present disclosure includes the following steps.

Step 101: Obtain a frequency domain response amplitude of a channel from an HFC network.

During failure analysis, the frequency domain response amplitude of the channel may be obtained directly from the HFC network. A manner of directly obtaining the frequency domain response amplitude of the channel may be as follows. An apparatus such as a network analyzer directly obtains, by means of channel test, subcarrier frequencies $f_1$, $f_2$, ..., and $f_n$ of a communications channel and amplitude values corresponding to the frequencies. An amplitude-frequency curve of the subcarrier frequencies and the amplitude values corresponding to the subcarrier frequencies is the frequency domain response amplitude of the channel.

In actual application, alternatively, another manner may be used to directly obtain the frequency domain response amplitude of the channel. For example, DOCSIS 3.3.0 defines a pre-equalizer, which uses frequency domain equalization. The pre-equalizer is a linear filter with multiple tap coefficients, where the tap coefficients are referred to as pre-equalization coefficients, and there are many pre-equalization coefficients. The pre-equalizer uses frequency domain equalization. Therefore, a frequency domain response amplitude may be obtained directly using tap coefficients collected from an HFC network device with the pre-equalizer disposed inside, provided that the frequency domain response amplitude can be directly obtained by means of collection. A specific manner is not limited herein.

Step 102: Perform linear fitting on an effective portion of the frequency domain response amplitude to determine a channel slope value.

It should be noted that, a frequency domain response of a channel with a slope has the following two regular patterns.

(1) After an in-band frequency domain response of the channel is obtained and an amplitude unit is converted into a logarithm unit (such as decibel (dB) or bel (B)) of the frequency domain response, a linear relationship exists between a frequency and an amplitude.

This phenomenon is related to a characteristic of a cable line component. For example, a cable attenuation loss has a linear relationship with the frequency. To compensate for a slope characteristic caused by cable attenuation, an amplifier may set a gain slope, and the gain slope also indicates the linear relationship between the amplitude and the frequency. A linear relationship exists between the in-band frequency domain response of the entire channel and the frequency when a deviation exists between an attenuation slope (a negative value) and the gain slope (a positive value).

(2) Approximately 80% of the frequency domain response amplitude in the middle presents a linear relationship, and a return-to-zero phenomenon occurs on 10% of the amplitude on the left and 10% of the amplitude on the right.

Generally, the portion, presenting the linear relationship, of the frequency domain response amplitude is referred to as the effective portion of the frequency domain response amplitude. This phenomenon is related to a quantity of time domain tap coefficients. A larger quantity of tap coefficients indicates a larger distance of translation of two extreme points in the frequency domain response amplitude curve respectively towards two ends, and further indicates a wider linear region. In order that an entire frequency domain has a linear relationship with the amplitude, an infinite quantity of time domain tap coefficients are required.

In this embodiment, the effective portion of the frequency domain response amplitude may be determined according to the frequency domain response amplitude after the frequency domain response amplitude is obtained. The effective portion of the frequency domain response amplitude is further a portion, presenting a linear relationship, of the frequency domain response amplitude.

Because the effective portion of the frequency domain response amplitude presents a linear relationship, the channel slope value may be determined after linear fitting (or linear regression) is performed on the effective portion of the frequency domain response amplitude. The channel slope value is a slope value that is obtained after linear fitting is performed on the effective portion of the frequency domain response amplitude of the channel.

Step 103: Perform channel failure analysis according to the channel slope value.

Because the channel slope value can reflect some true channel statuses, channel failure analysis can be performed according to the channel slope value.

In this embodiment, failure analysis is performed according to an obtained channel slope value, and the channel slope value is a new failure analysis parameter. In this way, means of channel failure analysis increase, and channel failure analysis is more accurate.

Figure 2:
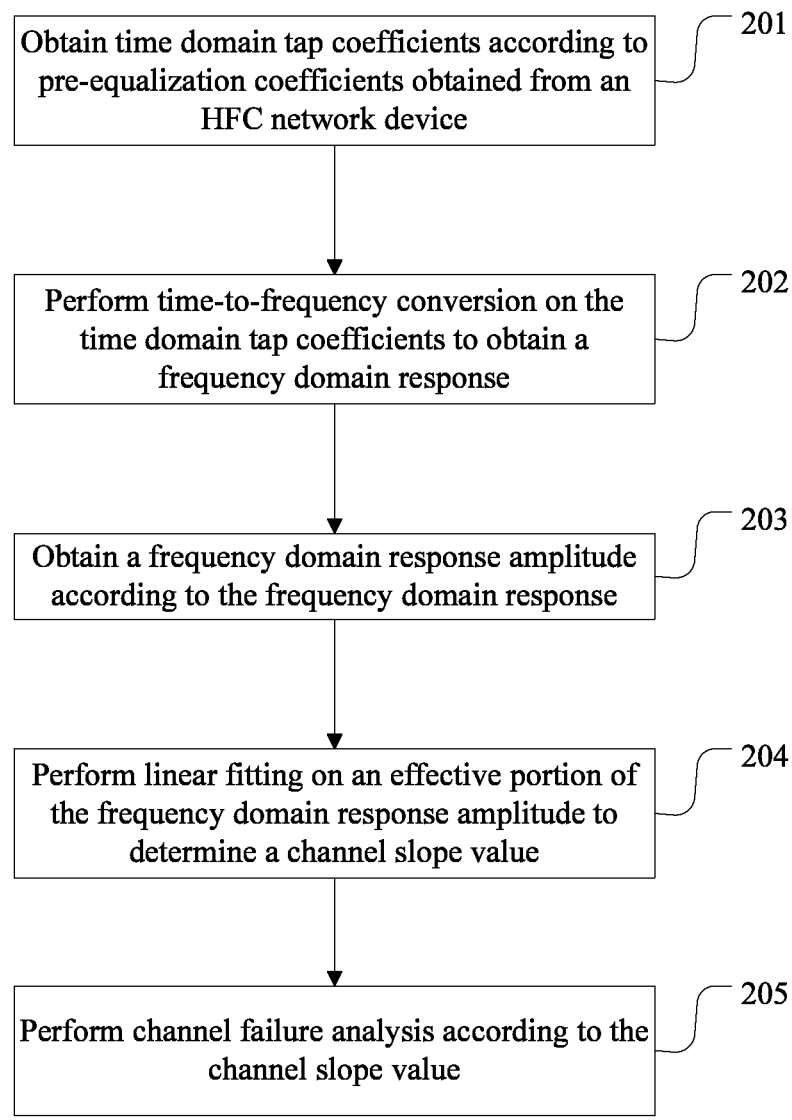
FIG. 2 is a schematic flowchart diagram of another embodiment of a failure analysis method according to the embodiments of the present disclosure.

The obtaining a frequency domain response amplitude from an HFC network in the embodiment shown in FIG. 1 may alternatively include obtaining the frequency domain response amplitude according to pre-equalization coefficients. Referring to FIG. 2, another embodiment of a failure analysis method in the present disclosure includes the following steps.

Step 201: Obtain time domain tap coefficients according to pre-equalization coefficients obtained from an HFC network device.

DOCSIS 3.0 defines a pre-equalizer. The pre-equalizer defined in DOCSIS 3.0 is a linear filter with 24 tap coefficients, where the 24 coefficients are referred to as pre-equalization coefficients. Parameters such as time domain tap coefficients and an in-band frequency domain response may be obtained by means of conversion according to the pre-equalization coefficients. A delay of each time domain tap coefficient is one symbol, and each of the time domain tap coefficients has a different amplitude.

It should be noted that, in this embodiment, the HFC network device is an HFC network device with the foregoing pre-equalizer disposed inside. The HFC network device may be a CMTS, a CM, or the like, which is not limited herein.

During failure analysis, all pre-equalization coefficients of the pre-equalizer may be obtained in advance by means of collection from the HFC network device on a local area network or a wide area network, and then all time domain tap coefficients may be obtained according to the pre-equalization coefficients.

Step 202: Perform time-to-frequency conversion on the time domain tap coefficients to obtain a frequency domain response.

A frequency domain response of a channel may be obtained by performing time-to-frequency conversion, for example, Fourier transform, on all the time domain tap coefficients.

At present, in the HFC network device with the pre-equalizer disposed inside, the linear filter has relatively few time domain tap coefficients, generally being 24. Each time domain tap coefficient corresponds to one time domain point number. To improve precision, a given quantity (for example, 256) of zeros may be added after time domain point numbers to obtain new coefficients, and the new coefficients are converted into the frequency domain response such that there are more frequency domain response point numbers. For example, when there are 24 time domain tap coefficients and 256 frequency domain point numbers, assuming that the time domain tap coefficients are C=(C1, . . . , C24), (256−24=232) zeros are added after the time domain tap coefficients to obtain new coefficients C'=(C1, . . . , C24, 0, . . . , 0), and time-to-frequency conversion is performed on the new coefficients to obtain the frequency domain response F=FFT(C')=(F1, . . . , F256).

Step 203: Obtain a frequency domain response amplitude according to the frequency domain response.

The frequency domain response amplitude of the channel may be obtained by performing amplitude evaluation on the frequency domain response obtained in step 202. For example, the frequency domain response obtained in step 202 is F=FFT(C')=(F1, . . . , F256), and the frequency domain response amplitude Fmag=(Fmag1, . . . , Fmag256) of the channel may be obtained by performing amplitude evaluation on the frequency domain response F.

Step 204: Perform linear fitting on an effective portion of the frequency domain response amplitude to determine a channel slope value.

In this embodiment, the effective portion of the frequency domain response amplitude may be determined according to the frequency domain response amplitude after the frequency domain response amplitude is obtained. The effective portion of the frequency domain response amplitude is further a portion, presenting a linear relationship, of the frequency domain response amplitude.

Because the effective portion of the frequency domain response amplitude presents a linear relationship, the channel slope value may be determined after linear fitting (or linear regression) is performed on the effective portion of the frequency domain response amplitude. The channel slope value is a slope value that is obtained after linear fitting is performed on the effective portion of the frequency domain response amplitude of the channel.

Step 205: Perform channel failure analysis according to the channel slope value.

Because the channel slope value can reflect some true channel statuses, channel failure analysis can be performed according to the channel slope value.

In this embodiment, a frequency domain response amplitude of a channel is obtained by means of conversion on time domain tap coefficients, and failure analysis is performed according to a channel slope value that is obtained according to the frequency domain response amplitude of the channel, and the channel slope value is a new failure analysis parameter. In this way, means of channel failure analysis increase, and channel failure analysis is more accurate.

In the embodiment shown in FIG. 1 or FIG. 2, there are many manners of performing channel failure analysis according to channel slope value. For example, channel quality may be analyzed according to the channel slope value, where the channel slope value is inversely proportional to the channel quality. The following describes a failure analysis process using an example in which channel quality is analyzed according to channel slope value.

Figure 3:
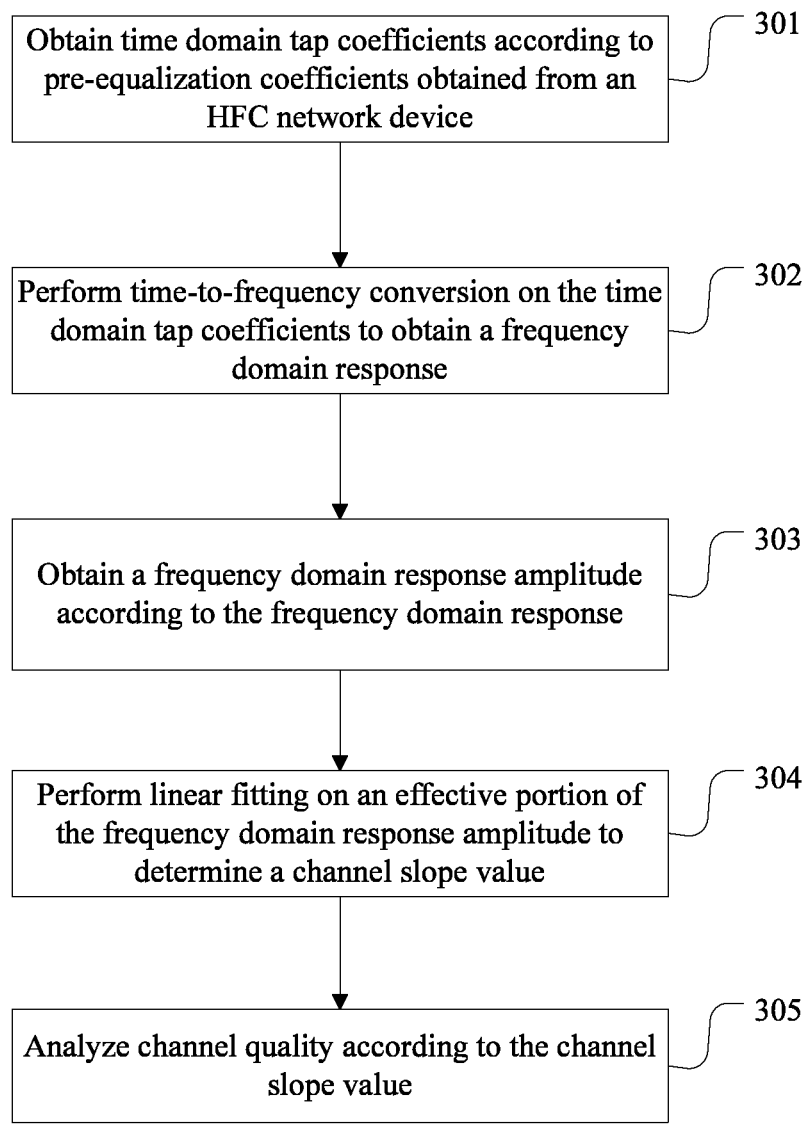
FIG. 3 is a schematic flowchart diagram of another embodiment of a failure analysis method according to the embodiments of the present disclosure.

Referring to FIG. 3, another embodiment of a failure analysis method in the present disclosure includes the following steps.

Step 301: Obtain time domain tap coefficients according to pre-equalization coefficients obtained from an HFC network device.

DOCSIS 3.0 defines a pre-equalizer. The pre-equalizer defined in DOCSIS 3.0 is a linear filter with 24 tap coefficients, where the 24 coefficients are referred to as pre-equalization coefficients. Parameters such as time domain tap coefficients and an in-band frequency domain response may be obtained by means of conversion according to the pre-equalization coefficients. A delay of each time domain tap coefficient is one symbol, and each of the time domain tap coefficients has a different amplitude.

It should be noted that, in this embodiment, the HFC network device is an HFC network device with the foregoing pre-equalizer disposed inside. The HFC network device may be a CMTS, a CM, or the like, which is not limited herein.

During failure analysis, all pre-equalization coefficients of the pre-equalizer may be obtained in advance by means of collection from the HFC network device on a local area network or a wide area network, and then all time domain tap coefficients may be obtained according to the pre-equalization coefficients.

Step 302: Perform time-to-frequency conversion on the time domain tap coefficients to obtain a frequency domain response.

A frequency domain response of a channel may be obtained by performing time-to-frequency conversion, for example, Fourier transform, on all the time domain tap coefficients.

At present, in the HFC network device with the pre-equalizer disposed inside, the linear filter has relatively few time domain tap coefficients, generally being 24. Each time domain tap coefficient corresponds to one time domain point number. To improve precision, a given quantity (for example, 256) of zeros may be added after time domain point numbers to obtain new coefficients, and the new coefficients are converted into the frequency domain response such that there are more frequency domain response point numbers. For example, when there are 24 time domain tap coefficients and 256 frequency domain point numbers, assuming that the time domain tap coefficients are $C=(C1, \ldots, C24)$, $(256-24=232)$ zeros are added after the time domain tap coefficients to obtain new coefficients $C'=(C1, \ldots, C24, 0, \ldots, 0)$, and time-to-frequency conversion is performed on the new coefficients to obtain the frequency domain response $F=FFT(C')=(F1, \ldots, F256)$.

Step 303: Obtain a frequency domain response amplitude according to the frequency domain response.

The frequency domain response amplitude of the channel may be obtained by performing amplitude evaluation on the frequency domain response obtained in step 302. For example, the frequency domain response obtained in step 302 is $F=FFT(C')=(F1, \ldots, F256)$, and the frequency domain response amplitude $Fmag=(Fmag1, \ldots, Fmag256)$ of the channel may be obtained by performing amplitude evaluation on the frequency domain response F.

Step 304: Perform linear fitting on an effective portion of the frequency domain response amplitude to determine a channel slope value.

In this embodiment, the effective portion of the frequency domain response amplitude may be determined according to the frequency domain response amplitude after the frequency domain response amplitude is obtained. The effective portion of the frequency domain response amplitude is further a portion, presenting a linear relationship, of the frequency domain response amplitude.

Because the effective portion of the frequency domain response amplitude presents a linear relationship, the channel slope value may be determined after linear fitting (or linear regression) is performed on the effective portion of the frequency domain response amplitude. The channel slope value is a slope value that is obtained after linear fitting is performed on the effective portion of the frequency domain response amplitude of the channel.

Step 305: Analyze channel quality according to the channel slope value.

The channel quality may be determined according to the channel slope value, where the channel slope value is inversely proportional to the channel quality. A larger channel slope value indicates a more unreliable channel, which causes a larger bit error rate and lower channel quality.

There are many manners of performing failure analysis according to the channel slope value, and herein that the channel quality is analyzed according to the channel slope value is only used as an example for description. It may be understood that, in actual application, channel failure analysis may be alternatively performed according to the channel slope value in another manner. For example, alternatively, comparative analysis may be performed on channel slope values of a channel for multiple different users with reference to a network topology structure in order to search for a location and a cause of a channel tilt and perform recovery. For example, it is found that channel slope values, set by an amplifier, for all users are relatively large, and it may be inferred that the relatively large slope values are caused by inappropriate adjustment of a gain slope by the amplifier. Corresponding compensation may be provided according to the channel slope values in order to return the channel slopes to zero and ensure a stable in-band frequency domain response, thereby improving signal transmission quality.

It should be noted that, alternatively, channel failure analysis may be performed according to the channel slope value using a combination of multiple means, which is not limited herein.

It may be understood that, in this embodiment, a description is further provided in which a specific means of performing failure analysis according to the channel slope value may also be applied to an embodiment of directly obtaining the frequency domain response amplitude, which is not limited herein.

In this embodiment, a frequency domain response amplitude of a channel is obtained by means of conversion on time domain tap coefficients, and failure analysis is performed according to a channel slope value that is obtained according to the frequency domain response amplitude of the channel, and the channel slope value is a new failure analysis parameter. In this way, means of channel failure analysis increase, and channel failure analysis is more accurate. In addition, a specific means of performing failure analysis according to the channel slope value is further described, making an implementation manner more specific.

Figure 4:
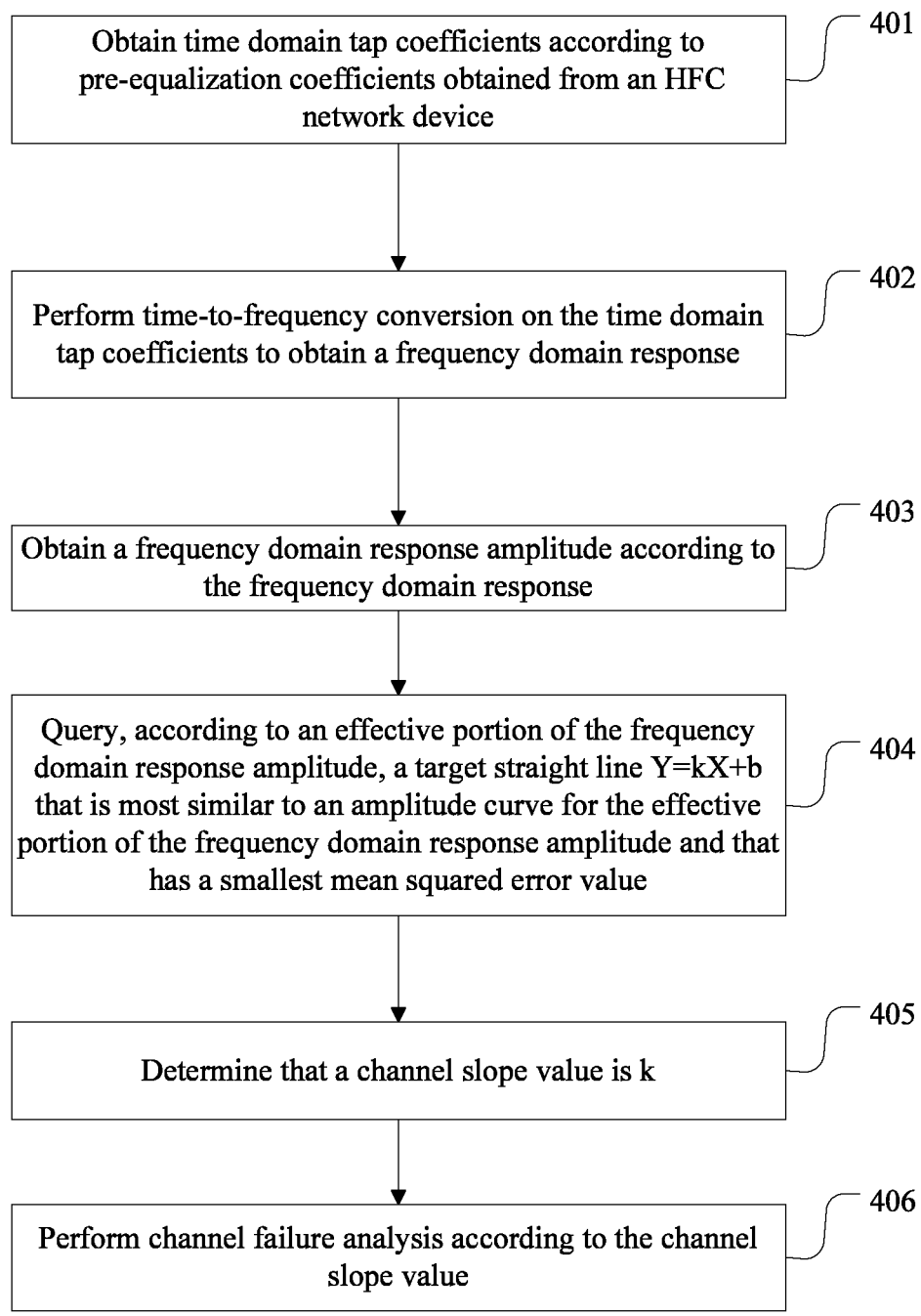
FIG. 4 is a schematic flowchart diagram of another embodiment of a failure analysis method according to the embodiments of the present disclosure.

The following uses a specific embodiment to describe a specific process of performing linear fitting on an effective portion of a frequency domain response amplitude to determine a channel slope value. Referring to FIG. 4, another embodiment of a failure analysis method in the present disclosure includes the following steps.

Step 401: Obtain time domain tap coefficients according to pre-equalization coefficients obtained from an HFC network device.

DOCSIS 3.0 defines a pre-equalizer. The pre-equalizer defined in DOCSIS 3.0 is a linear filter with 24 tap coefficients, where the 24 coefficients are referred to as pre-equalization coefficients. Parameters such as time domain tap coefficients and an in-band frequency domain response may be obtained by means of conversion according to the pre-equalization coefficients. A delay of each time domain tap coefficient is one symbol, and each of the time domain tap coefficients has a different amplitude.

It should be noted that, in this embodiment, the HFC network device is an HFC network device with the foregoing pre-equalizer disposed inside. The HFC network device may be a CMTS, a CM, or the like, which is not limited herein.

During failure analysis, all pre-equalization coefficients of the pre-equalizer may be obtained in advance by means of collection from the HFC network device on a local area network or a wide area network, and then all time domain tap coefficients may be obtained according to the pre-equalization coefficients.

Step 402: Perform time-to-frequency conversion on the time domain tap coefficients to obtain a frequency domain response.

A frequency domain response of a channel may be obtained by performing time-to-frequency conversion, for example, Fourier transform, on all the time domain tap coefficients.

At present, in the HFC network device with the pre-equalizer disposed inside, the linear filter has relatively few time domain tap coefficients, generally being 24. Each time domain tap coefficient corresponds to one time domain point number. To improve precision, a given quantity (for example, 256) of zeros may be added after time domain point numbers to obtain new coefficients, and the new coefficients are converted into the frequency domain response such that there are more frequency domain response point numbers. For example, when there are 24 time domain tap coefficients and 256 frequency domain point numbers, assuming that the time domain tap coefficients are C=(C1, ..., C24), (256−24=232) zeros are added after the time domain tap coefficients to obtain new coefficients C'=(C1, ..., C24, 0, ..., 0), and time-to-frequency conversion is performed on the new coefficients to obtain the frequency domain response F=FFT(C')=(F1, ..., F256).

Step 403: Obtain a frequency domain response amplitude according to the frequency domain response.

The frequency domain response amplitude of the channel may be obtained by performing amplitude evaluation on the frequency domain response obtained in step 402. For example, the frequency domain response obtained in step 402 is F=FFT(C')=(F1, ..., F256), and the frequency domain response amplitude Fmag=(Fmag1, ..., Fmag256) of the channel may be obtained by performing amplitude evaluation on the frequency domain response F.

Step 404: Query, according to an effective portion of the frequency domain response amplitude, a target straight line Y=kX+b that is most similar to an amplitude curve for the effective portion of the frequency domain response amplitude and that has a smallest mean squared error value, where the error value is $\Sigma(FmagB-Y)^2$.

Linear fitting, or linear regression, refers to finding a straight line Y=kX+b that is most similar to an amplitude curve for FmagB and that has a smallest mean squared error.

In this embodiment, the effective portion of the frequency domain response amplitude is further a portion, presenting a linear relationship, of the frequency domain response amplitude. The target straight line Y=kX+b that is most similar to the amplitude curve for the effective portion of the frequency domain response amplitude and that has the smallest mean squared error value $\Sigma(FmagB-Y)^2$ may be queried according to the effective portion of the frequency domain response amplitude, where FmagB is the effective portion of the frequency domain response amplitude.

In the foregoing linear fitting, the least square method is a most commonly used algorithm that may be used to calculate parameters k and b ensuring a smallest error. In actual application, alternatively, k and b may be directly obtained according to the effective portion FmagB of the frequency domain response amplitude using software supporting linear regression analysis, such as EXCEL, ORIGIN, and MATLAB, which is not limited herein. After the parameters k and b are obtained by means of calculation, a slope value k is determined.

Because the effective portion of the frequency domain response amplitude presents a linear relationship, the channel slope value may be determined after linear fitting (or linear regression) is performed on the effective portion of the frequency domain response amplitude. The channel slope value is a slope value that is obtained after linear fitting is performed on the effective portion of the frequency domain response amplitude of the channel.

Step 405: Determine that a channel slope value is k.

That the channel slope value is k may be determined according to the target straight line Y=kX+b obtained in step 404.

Step 406: Perform channel failure analysis according to the channel slope value.

Because the channel slope value can reflect some true channel statuses, channel failure analysis can be performed according to the channel slope value. A method for performing failure analysis according to the channel slope value may be the same as that in the embodiment shown in FIG. 3, and details are not described herein again.

It may be understood that, in this embodiment, the further described specific means of performing linear fitting on the effective portion of the frequency domain response amplitude to determine the channel slope value may also be applied to an embodiment of directly obtaining the frequency domain response amplitude, which is not limited herein.

In this embodiment, a frequency domain response amplitude of a channel is obtained by means of conversion on time domain tap coefficients, and failure analysis is performed according to a channel slope value that is obtained according to the frequency domain response amplitude of the channel, and the channel slope value is a new failure analysis parameter. In this way, means of channel failure analysis increase, and channel failure analysis is more accurate. In addition, a specific means of performing linear fitting on an effective portion of the frequency domain response amplitude to determine the channel slope value is further described, making an implementation manner more specific.

When the frequency domain response amplitude is obtained by means of conversion on the time domain tap coefficients, an edge effect of a linear filter of the HFC network device such as a CMTS or a CM is quite apparent on an uplink edge channel (for example, a channel with 8 megahertz (MHz), 38 MHz, or the like as a center frequency). Therefore, the obtained frequency domain response amplitude has a slope characteristic of being quite steep. The pre-equalization coefficients further compensate for unreliability. When the pre-equalization coefficients are determined by the filter or the slope characteristic of the channel, channel failure analysis is affected, and consequently, fault misjudgment, inaccurate fault locating, and the like are caused. Therefore, when the frequency domain response amplitude is obtained by means of conversion on the time domain tap coefficients, slope correction may be performed on the obtained time domain tap coefficients, and failure analysis is performed according to parameters obtained after correction (for example, a corrected frequency domain response amplitude and corrected time domain tap coefficients). The following describes a specific embodiment.

Figure 5:
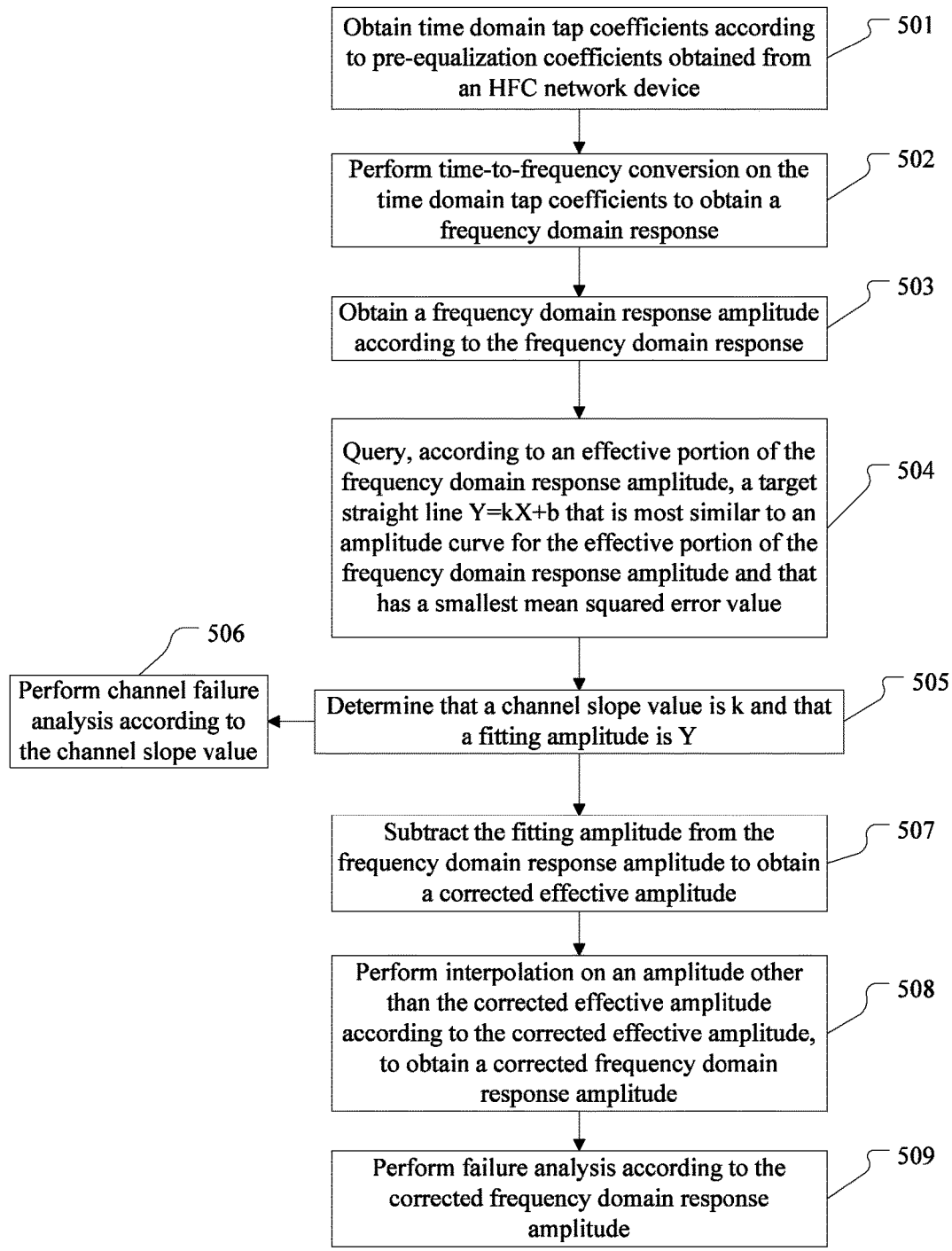
FIG. 5 is a schematic flowchart diagram of another embodiment of a failure analysis method according to the embodiments of the present disclosure.

Referring to FIG. 5, another embodiment of a failure analysis method in the present disclosure includes the following steps.

Step 501: Obtain time domain tap coefficients according to pre-equalization coefficients obtained from an HFC network device.

DOCSIS 3.0 defines a pre-equalizer. The pre-equalizer defined in DOCSIS 3.0 is a linear filter with 24 tap coefficients, where the 24 coefficients are referred to as pre-equalization coefficients. Parameters such as time domain tap coefficients and an in-band frequency domain response may be obtained by means of conversion according to the pre-equalization coefficients. A delay of each time domain tap coefficient is one symbol, and each of the time domain tap coefficients has a different amplitude.

It should be noted that, in this embodiment, the HFC network device is an HFC network device with the foregoing pre-equalizer disposed inside. The HFC network device may be a CMTS, a CM, or the like, which is not limited herein.

During failure analysis, all pre-equalization coefficients of the pre-equalizer may be obtained in advance by means of collection from the HFC network device on a local area network or a wide area network, and then all time domain tap coefficients may be obtained according to the pre-equalization coefficients.

Step 502: Perform time-to-frequency conversion on the time domain tap coefficients to obtain a frequency domain response.

A frequency domain response of a channel may be obtained by performing time-to-frequency conversion, for example, Fourier transform, on all the time domain tap coefficients.

At present, in the HFC network device with the pre-equalizer disposed inside, the linear filter has relatively few time domain tap coefficients, generally being 24. Each time domain tap coefficient corresponds to one time domain point number. To improve precision, a given quantity (for example, 256) of zeros may be added after time domain point numbers to obtain new coefficients, and the new coefficients are converted into the frequency domain response such that there are more frequency domain response point numbers. For example, when there are 24 time domain tap coefficients and 256 frequency domain point numbers, assuming that the time domain tap coefficients are $C=(C1, \ldots, C24)$, (256−24=232) zeros are added after the time domain tap coefficients to obtain new coefficients $C'=(C1, \ldots, C24, 0, \ldots, 0)$, and time-to-frequency conversion is performed on the new coefficients to obtain the frequency domain response $F=FFT(C')=(F1, \ldots, F256)$.

Step 503: Obtain a frequency domain response amplitude according to the frequency domain response.

The frequency domain response amplitude of the channel may be obtained by performing amplitude evaluation on the frequency domain response obtained in step 502. For example, the frequency domain response obtained in step 502 is $F=FFT(C')=(F1, \ldots, F256)$, and the frequency domain response amplitude $Fmag=(Fmag1, \ldots, Fmag256)$ of the channel may be obtained by performing amplitude evaluation on the frequency domain response F.

Step 504: Query, according to an effective portion of the frequency domain response amplitude, a target straight line $Y=kX+b$ that is most similar to an amplitude curve for the effective portion of the frequency domain response amplitude and that has a smallest mean squared error value, where the error value is $\Sigma(FmagB-Y)^2$.

Linear fitting, or linear regression, refers to finding a straight line $Y=kX+b$ that is most similar to an amplitude curve for FmagB and that has a smallest mean squared error.

In this embodiment, the effective portion of the frequency domain response amplitude is further a portion, presenting a linear relationship, of the frequency domain response amplitude. The target straight line $Y=kX+b$ that is most similar to the amplitude curve for the effective portion of the frequency domain response amplitude and that has the smallest mean squared error value $\Sigma(FmagB-Y)^2$ may be queried according to the effective portion of the frequency domain response amplitude, where FmagB is the effective portion of the frequency domain response amplitude.

In the foregoing linear fitting, the least square method is a most commonly used algorithm that may be used to calculate parameters k and b ensuring a smallest error. In actual application, alternatively, k and b may be directly obtained according to the effective portion FmagB of the frequency domain response amplitude using software supporting linear regression analysis, such as EXCEL, ORIGIN, and MATLAB, which is not limited herein. After the parameters k and b are obtained by means of calculation, a slope value k is determined.

Because the effective portion of the frequency domain response amplitude presents a linear relationship, the channel slope value may be determined after linear fitting (or linear regression) is performed on the effective portion of the frequency domain response amplitude. The channel slope value is a slope value that is obtained after linear fitting is performed on the effective portion of the frequency domain response amplitude of the channel.

Step 505: Determine that a channel slope value is k and that a fitting amplitude is Y.

That k is the channel slope value and Y is the fitting amplitude may be respectively determined according to the target straight line $Y=kX+b$ obtained in step 504.

Step 506: Perform channel failure analysis according to the channel slope value.

Because the channel slope value can reflect some true channel statuses, channel failure analysis can be performed according to the channel slope value. A method for performing failure analysis according to the channel slope value may be the same as that in the embodiment shown in FIG. 3, and details are not described herein again.

Step 507: Subtract the fitting amplitude from the frequency domain response amplitude to obtain a corrected effective amplitude.

A numerical value of the fitting amplitude is subtracted from a numerical value of the frequency domain response amplitude, that is, a slope characteristic may be eliminated from the frequency domain response of the channel in order to obtain the corrected effective amplitude.

Step 508: Perform interpolation on an amplitude other than the corrected effective amplitude according to the corrected effective amplitude, to obtain a corrected frequency domain response amplitude.

The corrected frequency domain response amplitude may be obtained by performing interpolation on the amplitude other than the corrected effective amplitude according to the corrected effective amplitude. An interpolation manner may be interpolation using MATLAB. A specific means of performing interpolation on an amplitude is according to the other approaches, which is not limited herein.

Step 509: Perform failure analysis according to the corrected frequency domain response amplitude.

Because the corrected frequency domain response amplitude may reflect some true channel statues, channel failure analysis can be performed according to the corrected frequency domain response amplitude.

A frequency difference between any two points in a frequency domain response amplitude curve may be determined by analyzing a corrected frequency domain response amplitude curve. Therefore, a frequency difference $\Delta f$ between two consecutive amplitude maximum points or between two consecutive amplitude minimum points in the frequency domain response amplitude curve may be obtained according to the corrected frequency domain response amplitude. A micro-reflection delay is calculated according to $\Delta f$, where the micro-reflection delay is a reciprocal of a difference between frequency channel numbers, that is, $\Delta t=1/\Delta f$. A distance $TDR=\Delta t*v/2$ between two fault sources is calculated according to $\Delta t$ and a signal transmission speed v. As the distance between the two fault sources is known, fault information may be reflected and fault locating may be performed.

It should be noted that, the corrected frequency domain response amplitude may be further used to calculate a micro-reflection level (MRLevel). A fluctuation magnitude of the corrected frequency domain response amplitude, that is, a difference between an amplitude maximum value and an amplitude minimum value, may be known by analyzing the corrected frequency domain response amplitude curve, and then the MRLevel may be calculated. The MRLevel is used to evaluate severity of line micro-reflection. An MRLevel value is related to fluctuation of the frequency domain response amplitude curve of the channel. A larger fluctuation magnitude indicates a larger MRLevel value and a more serious fault. Generally, network states of a CM are classified into three levels according to an MRLevel value, as shown in Table 1.

TABLE 1

Three network states of a CM defined according to an MRLevel value

| MRLevel | Network state | Phenomenon |
| --- | --- | --- |
| <−25 dB | Health | High network performance |
| −25 dB to −18 dB | Sub-health | A fault not affecting services, and not sensed by users |
| >−18 dB | Fault | A fault affecting services, and user complaints received |

After the MRLevel is calculated according to the difference between the amplitude maximum value and the amplitude minimum value of the corrected frequency domain response amplitude, fault discovery, locating, and recovery may be performed in advance when a network is in a sub-healthy state (that is, before a fault affects a service), thereby improving user experience.

It may be understood that, in this embodiment, content of obtaining the corrected frequency domain response amplitude and performing failure analysis according to the corrected frequency domain response amplitude may also be applied to an embodiment of directly obtaining the frequency domain response amplitude, which is not limited herein.

In this embodiment, a frequency domain response amplitude of a channel is obtained by means of conversion on time domain tap coefficients, and failure analysis is performed according to a channel slope value that is obtained according to the frequency domain response amplitude of the channel, and the channel slope value is a new failure analysis parameter. In this way, means of channel failure analysis increase, and channel failure analysis is more accurate. In addition, a corrected frequency domain response amplitude is obtained, which avoids a problem of inaccurate channel failure analysis resulting from directly using the frequency domain response amplitude for failure analysis.

Figure 6:
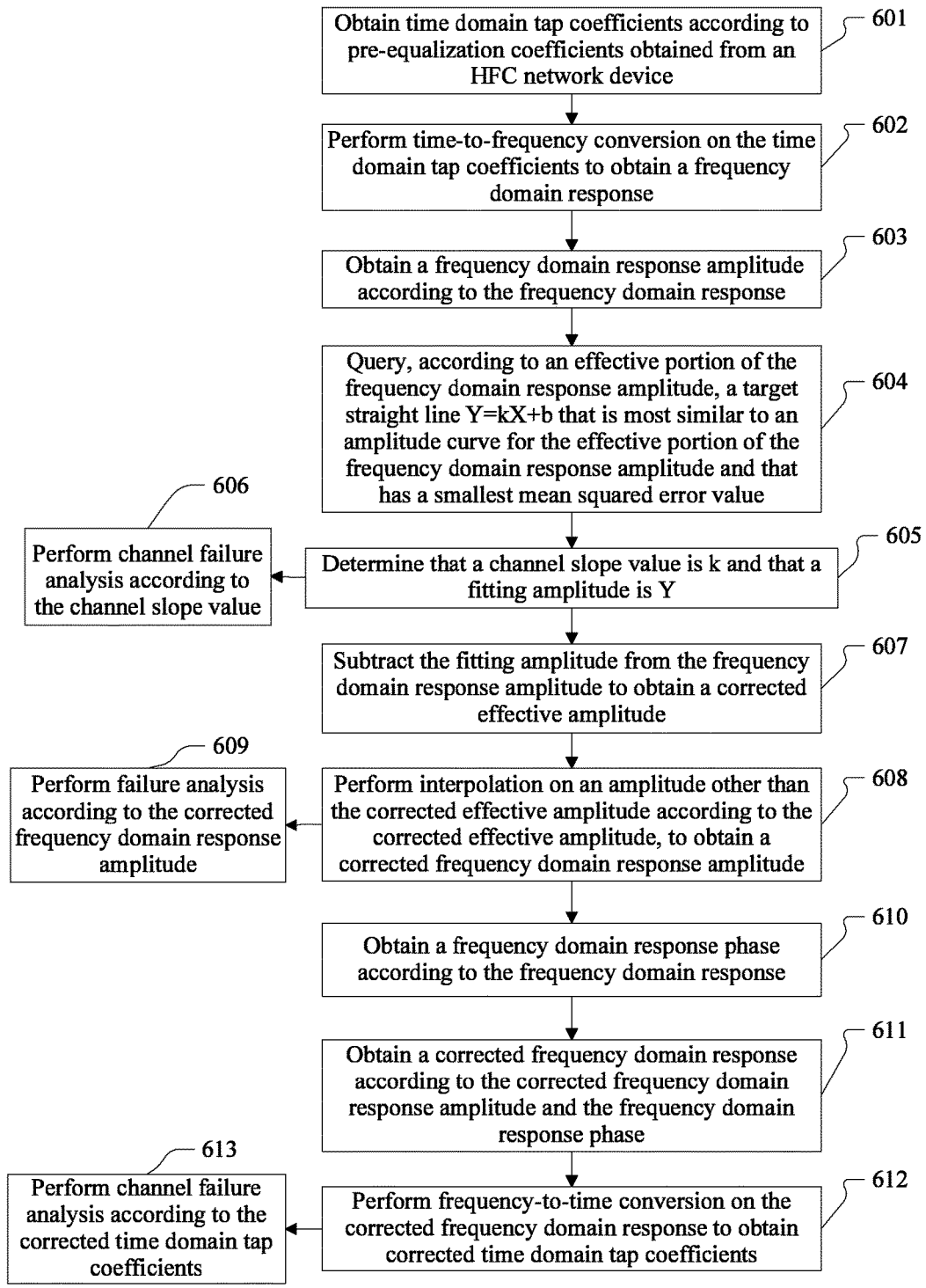
FIG. 6 is a schematic flowchart diagram of another embodiment of a failure analysis method according to the embodiments of the present disclosure.

Based on the embodiment shown in FIG. 5, corrected time domain tap coefficients may be further obtained, and failure analysis is performed according to the corrected time domain tap coefficients. Referring to FIG. 6, another embodiment of a failure analysis method in the present disclosure includes the following steps.

Step 601: Obtain time domain tap coefficients according to pre-equalization coefficients obtained from an HFC network device.

DOCSIS 3.0 defines a pre-equalizer. The pre-equalizer defined in DOCSIS 3.0 is a linear filter with 24 tap coefficients, where the 24 coefficients are referred to as pre-equalization coefficients. Parameters such as time domain tap coefficients and an in-band frequency domain response may be obtained by means of conversion according to the pre-equalization coefficients. A delay of each time domain tap coefficient is one symbol, and each of the time domain tap coefficients has a different amplitude.

It should be noted that, in this embodiment, the HFC network device is an HFC network device with the foregoing pre-equalizer disposed inside. The HFC network device may be a CMTS, a CM, or the like, which is not limited herein.

During failure analysis, all pre-equalization coefficients of the pre-equalizer may be obtained in advance by means of collection from the HFC network device on a local area network or a wide area network, and then all time domain tap coefficients may be obtained according to the pre-equalization coefficients.

Step 602: Perform time-to-frequency conversion on the time domain tap coefficients to obtain a frequency domain response.

A frequency domain response of a channel may be obtained by performing time-to-frequency conversion, for example, Fourier transform, on all the time domain tap coefficients.

At present, in the HFC network device with the pre-equalizer disposed inside, the linear filter has relatively few time domain tap coefficients, generally being 24. Each time domain tap coefficient corresponds to one time domain point number. To improve precision, a given quantity (for example, 256) of zeros may be added after time domain point numbers to obtain new coefficients, and the new coefficients are converted into the frequency domain response such that there are more frequency domain response point numbers. For example, when there are 24 time domain tap coefficients and 256 frequency domain point numbers, assuming that the time domain tap coefficients are C=(C1, . . . , C24), (256−24=232) zeros are added after the time domain tap coefficients to obtain new coefficients C'=(C1, . . . , C24, 0, . . . , 0), and time-to-frequency conversion is performed on the new coefficients to obtain the frequency domain response F=FFT(C')=(F1, . . . , F256).

Step 603: Obtain a frequency domain response amplitude according to the frequency domain response.

The frequency domain response amplitude of the channel may be obtained by performing amplitude evaluation on the frequency domain response obtained in step 602. For example, the frequency domain response obtained in step 602 is F=FFT(C')=(F1, . . . , F256), and the frequency domain response amplitude Fmag=(Fmag1, . . . , Fmag256) of the channel may be obtained by performing amplitude evaluation on the frequency domain response F.

Step 604: Query, according to an effective portion of the frequency domain response amplitude, a target straight line Y=kX+b that is most similar to an amplitude curve for the effective portion of the frequency domain response amplitude and that has a smallest mean squared error value, where the error value is $\Sigma(FmagB-Y)^2$.

Linear fitting, or linear regression, refers to finding a straight line Y=kX+b that is most similar to an amplitude curve for FmagB and that has a smallest mean squared error.

In this embodiment, the effective portion of the frequency domain response amplitude is further a portion, presenting a linear relationship, of the frequency domain response amplitude. The target straight line Y=kX+b that is most similar to the amplitude curve for the effective portion of the frequency domain response amplitude and that has the smallest mean squared error value $\Sigma(FmagB-Y)^2$ may be queried according to the effective portion of the frequency domain response amplitude, where FmagB is the effective portion of the frequency domain response amplitude.

In the foregoing linear fitting, the least square method is a most commonly used algorithm that may be used to calculate parameters k and b ensuring a smallest error. In actual application, alternatively, k and b may be directly obtained according to the effective portion FmagB of the frequency domain response amplitude using software supporting linear regression analysis, such as EXCEL, ORIGIN, and MATLAB, which is not limited herein. After the parameters k and b are obtained by means of calculation, a slope value k is determined.

Because the effective portion of the frequency domain response amplitude presents a linear relationship, the channel slope value may be determined after linear fitting (or linear regression) is performed on the effective portion of the frequency domain response amplitude. The channel slope value is a slope value that is obtained after linear fitting is performed on the effective portion of the frequency domain response amplitude of the channel.

Step 605: Determine that a channel slope value is k and that a fitting amplitude is Y.

That k is the channel slope value and Y is the fitting amplitude may be respectively determined according to the target straight line Y=kX+b obtained in step 604.

Step 606: Perform channel failure analysis according to the channel slope value.

Because the channel slope value can reflect some true channel statuses, channel failure analysis can be performed according to the channel slope value. A method for performing failure analysis according to the channel slope value may be the same as that in the embodiment shown in FIG. 3, and details are not described herein again.

Step 607: Subtract the fitting amplitude from the frequency domain response amplitude to obtain a corrected effective amplitude.

A numerical value of the fitting amplitude is subtracted from a numerical value of the frequency domain response amplitude, that is, a slope characteristic may be eliminated from the frequency domain response of the channel in order to obtain the corrected effective amplitude.

Step 608: Perform interpolation on an amplitude other than the corrected effective amplitude according to the corrected effective amplitude, to obtain a corrected frequency domain response amplitude.

The corrected frequency domain response amplitude may be obtained by performing interpolation on the amplitude other than the corrected effective amplitude according to the corrected effective amplitude. An interpolation manner may be interpolation using MATLAB. A specific means of performing interpolation on an amplitude is the prior art, which is not limited herein.

Step 609: Perform failure analysis according to the corrected frequency domain response amplitude.

Because the corrected frequency domain response amplitude may reflect some true channel statues, channel failure analysis can be performed according to the corrected frequency domain response amplitude.

A method for performing channel failure analysis according to the corrected frequency domain response amplitude is the same as that in the embodiment shown in FIG. 5, and details are not described herein again.

Step 610: Obtain a frequency domain response phase according to the frequency domain response.

The frequency domain response phase may be obtained by performing phase evaluation on the frequency domain response.

Step 611: Obtain a corrected frequency domain response according to the corrected frequency domain response amplitude and the frequency domain response phase.

The corrected frequency domain response may be obtained by means of calculation according to the corrected frequency domain response amplitude and the frequency domain response phase obtained in step 610.

Step 612: Perform frequency-to-time conversion on the corrected frequency domain response to obtain corrected time domain tap coefficients.

The corrected time domain tap coefficients may be obtained by performing frequency-to-time conversion, for example, inverse Fourier transform, on the corrected frequency domain response.

Step 613: Perform channel failure analysis according to the corrected time domain tap coefficients.

One or more derived channel parameters listed in the following Table 2 may be calculated using the corrected time domain tap coefficients, and failure analysis is performed according to the calculated derived channel parameter. For a specific meaning and calculation method of the derived channel parameter, reference is made to the PNMP white paper.

TABLE 2

| Derived channel parameter | |
|---|---|
| Parameter name | Parameter abbreviation |
| Time domain reflectometry | TDR |
| Micro-reflection level | MRLevel |
| Delay | Delay |
| Main tap compression | MTC |
| Non-main tap to total energy ratio | NMTER |
| Pre-main tap to total energy ratio | PreMTTER |
| Post-main tap to total energy ratio | PostMTTER |
| Pre-Post energy symmetry ratio | PPESR |

It may be understood that, in this embodiment, content of obtaining the corrected time domain tap coefficients and performing failure analysis according to the corrected time domain tap coefficients may also be applied to an embodiment of directly obtaining the frequency domain response amplitude, which is not limited herein.

Figure 7:
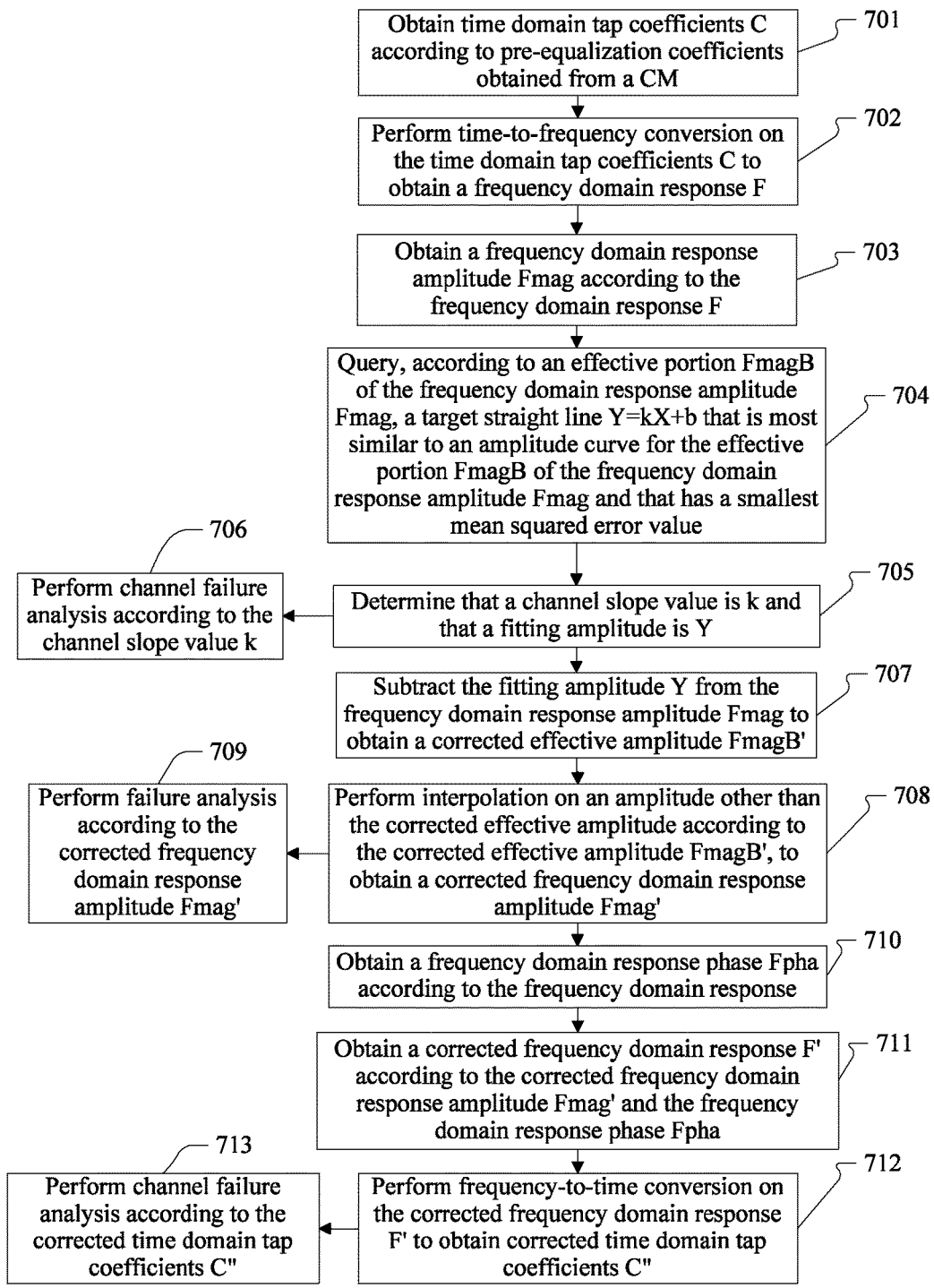
FIG. 7 is a schematic flowchart diagram of another embodiment of a failure analysis method according to the embodiments of the present disclosure.

To better understand the technology, the following details an embodiment of the present disclosure using a specific application scenario. Referring to FIG. 7, another embodiment of a failure analysis method in the present disclosure includes the following steps.

Step 701: Obtain time domain tap coefficients C according to pre-equalization coefficients obtained from a CM.

In this embodiment, an example in which an HFC network device is a CM is used for description. It may be understood that, the HFC network device is an HFC network device with the foregoing pre-equalizer disposed inside. For example, the HFC network device may alternatively be a CMTS, which is not limited herein.

During failure analysis, all pre-equalization coefficients of the pre-equalizer may be obtained in advance by means of collection from the HFC network device on a local area network or a wide area network, and then all time domain tap coefficients may be obtained according to the pre-equalization coefficients. For example, a linear filter has 24 time domain tap coefficients, and it is assumed that the time domain tap coefficients are $C=(C1, \ldots, C24)$.

Step 702: Perform time-to-frequency conversion on the time domain tap coefficients C to obtain a frequency domain response F.

A frequency domain response of a channel may be obtained by performing time-to-frequency conversion, for example, Fourier transform, on all the time domain tap coefficients.

At present, the linear filter of the CM has relatively few time domain tap coefficients. The linear filter has relatively few time domain tap coefficients, generally being 24. Each time domain tap coefficient corresponds to one time domain point number. To improve precision, a given quantity (for example, 256) of zeros may be added after time domain point numbers to obtain new coefficients, and the new coefficients are converted into the frequency domain response such that there are more frequency domain response point numbers. For example, when there are 24 time domain tap coefficients and 256 frequency domain point numbers, assuming that the time domain tap coefficients are $C=(C1, \ldots, C24)$, $(256-24=232)$ zeros are added after the time domain tap coefficients to obtain new coefficients $C'=(C1, \ldots, C24, 0, \ldots, 0)$, and time-to-frequency conversion is performed on the new coefficients to obtain the frequency domain response $F=FFT(C')=(F1, \ldots, F256)$.

Step 703: Obtain a frequency domain response amplitude Fmag according to the frequency domain response F.

The frequency domain response amplitude Fmag of the channel may be obtained by performing amplitude evaluation on the frequency domain response obtained in step 702. For example, the frequency domain response obtained in step 702 is $F=FFT(C')=(F1, \ldots, F256)$, and the frequency domain response amplitude $Fmag=(Fmag1, \ldots, Fmag256)$ of the channel may be obtained by performing amplitude evaluation on the frequency domain response F.

Step 704: Query, according to an effective portion FmagB of the frequency domain response amplitude Fmag, a target straight line $Y=kX+b$ that is most similar to an amplitude curve for the effective portion FmagB of the frequency domain response amplitude Fmag and that has a smallest mean squared error value, where the error value is $\Sigma(FmagB-Y)^2$.

Linear fitting, or linear regression, refers to finding a straight line $Y=kX+b$ that is most similar to an amplitude curve for FmagB and that has a smallest mean squared error.

In this embodiment, the effective portion FmagB of the frequency domain response amplitude Fmag is further a portion, presenting a linear relationship, of the frequency domain response amplitude Fmag. The target straight line $Y=kX+b$ that is most similar to the amplitude curve for the effective portion FmagB of the frequency domain response amplitude Fmag and that has a smallest mean squared error value $\Sigma(FmagB-Y)^2$ may be queried according to the effective portion FmagB of the frequency domain response amplitude Fmag.

In the foregoing linear fitting, the least square method is a most commonly used algorithm that may be used to calculate parameters k and b ensuring a smallest error. In actual application, alternatively, k and b may be directly obtained according to the effective portion FmagB of the frequency domain response amplitude Fmag using software supporting linear regression analysis, such as EXCEL, ORIGIN, and MATLAB, which is not limited herein. After the parameters k and b are obtained by means of calculation, a slope value k is determined.

In this embodiment, if the effective portion FmagB of the frequency domain response amplitude is 80% of the amplitude in the middle, that is, $FmagB=(Fmag27, \ldots, Fmag230)$, linear fitting is performed on FmagB by determining $Y=kX+B$, to obtain the slope k and a fitting amplitude Y. $Y=(Y27, \ldots, Y230)$, X is a series of frequency channel numbers, and $X=(27, \ldots, 230)/256$ in this embodiment.

Step 705: Determine that a channel slope value is k and that a fitting amplitude is Y.

That k is the channel slope value and Y is the fitting amplitude may be respectively determined according to the target straight line $Y=kX+b$ obtained in step 704.

Step 706: Perform channel failure analysis according to the channel slope value k.

Because the channel slope value can reflect some true channel statuses, channel failure analysis can be performed according to the channel slope value. A method for performing failure analysis according to the channel slope value may be the same as that in the embodiment shown in FIG. 3, and details are not described herein again.

Step 707: Subtract the fitting amplitude Y from the frequency domain response amplitude Fmag to obtain a corrected effective amplitude FmagB'.

A numerical value of the fitting amplitude is subtracted from a numerical value of the frequency domain response amplitude, that is, a slope characteristic may be eliminated from the frequency domain response of the channel in order to obtain the corrected effective amplitude.

In this embodiment, the corrected effective amplitude FmagB' is obtained by subtracting the fitting amplitude Y from the original amplitude Fmag, where $FmagB'=(Fmag27', \ldots, Fmag230')=FmagB-Y=(Fmag27-Y27, \ldots, Fmag230-Y230)$.

Step 708: Perform interpolation on an amplitude other than the corrected effective amplitude according to the corrected effective amplitude FmagB', to obtain a corrected frequency domain response amplitude Fmag'.

The corrected frequency domain response amplitude may be obtained by performing interpolation on the amplitude other than the corrected effective amplitude according to the corrected effective amplitude. An interpolation manner may be interpolation using MATLAB. A specific means of performing interpolation on an amplitude is the prior art, which is not limited herein.

In this embodiment, if the effective portion FmagB of the frequency domain response amplitude is 80% of the amplitude in the middle, 10% of the amplitude on the left and 10% of the amplitude on the right are respectively $FmagA'=(Fmag1, \ldots, Fmag26')$ and $FmagC'=(Fmag231', \ldots, Fmag256')$, which are obtained by means of interpolation according to the corrected effective amplitude FmagB'. In this case, the corrected frequency domain response amplitude is Fmag'=(FmagA', FmagB', FmagC')=(Fmag1, ..., Fmag256').

Step 709: Perform failure analysis according to the corrected frequency domain response amplitude Fmag'.

A method for performing channel failure analysis according to the corrected frequency domain response amplitude is the same as that in the embodiment shown in FIG. 5, and details are not described herein again.

Step 710: Obtain a frequency domain response phase Fpha according to the frequency domain response.

The frequency domain response phase Fpha=(Fpha1, ..., Fpha256) may be obtained by performing phase evaluation on the frequency domain response F.

Step 711: Obtain a corrected frequency domain response F' according to the corrected frequency domain response amplitude Fmag' and the frequency domain response phase Fpha.

In this embodiment, the corrected frequency domain response F'=(F1', ..., F256') may be obtained according to the corrected frequency domain response amplitude Fmag' and the phase Fpha.

Step 712: Perform frequency-to-time conversion on the corrected frequency domain response F' to obtain corrected time domain tap coefficients C''.

In this embodiment, a time domain series C''=(C1', ..., C256') may be obtained by performing frequency-to-time conversion, for example, inverse Fourier transform, on F'. In this case, the first 24 coefficients are selected and serve as the corrected time domain tap coefficients C''=(C1', ..., C24').

Step 713: Perform channel failure analysis according to the corrected time domain tap coefficients C''.

One or more derived channel parameters listed in the foregoing Table 2 may be calculated using the corrected time domain tap coefficients, and failure analysis is performed according to the calculated derived channel parameter. For a specific meaning and calculation method of the derived channel parameter, reference is made to the PNMP white paper.

Figure 8:
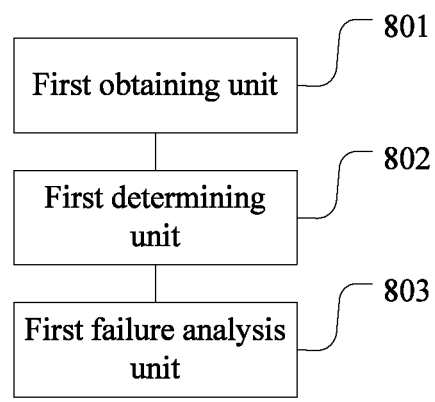
FIG. 8 is a schematic diagram of an embodiment of a failure analysis device according to the embodiments of the present disclosure.

The following describes embodiments of failure analysis devices in the embodiments of the present disclosure. Referring to FIG. 8, an embodiment of a failure analysis device in the embodiments of the present disclosure includes a first obtaining unit 801 configured to obtain a frequency domain response amplitude of a channel from an HFC network, a first determining unit 802 configured to perform linear fitting on an effective portion of the frequency domain response amplitude to determine a channel slope value, and a first failure analysis unit 803 configured to perform channel failure analysis according to the channel slope value.

In this embodiment, the first failure analysis unit 803 performs failure analysis according to a channel slope value determined by the first determining unit 802, and the channel slope value is a new failure analysis parameter. In this way, means of channel failure analysis increase, and channel failure analysis is more accurate.

Figure 9:
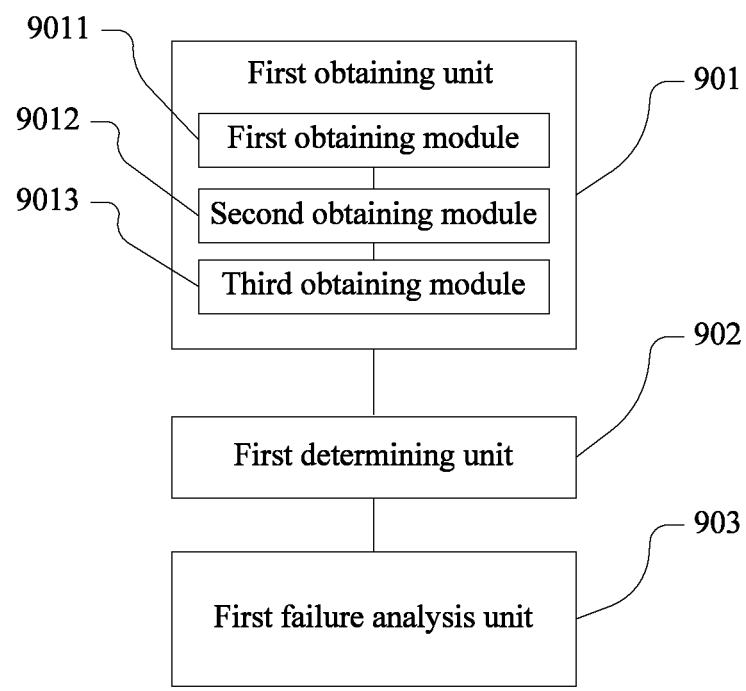
FIG. 9 is a schematic diagram of another embodiment of a failure analysis device according to the embodiments of the present disclosure.

Referring to FIG. 9, another embodiment of a failure analysis device in the embodiments of the present disclosure includes a first obtaining unit 901 configured to obtain a frequency domain response amplitude of a channel from an HFC network, a first determining unit 902 configured to perform linear fitting on an effective portion of the frequency domain response amplitude to determine a channel slope value, and a first failure analysis unit 903 configured to perform channel failure analysis according to the channel slope value.

In the failure analysis device in this embodiment, the first obtaining unit 901 may further include a first obtaining module 9011 configured to obtain time domain tap coefficients according to pre-equalization coefficients obtained from an HFC network device, a second obtaining module 9012 configured to perform time-to-frequency conversion on the time domain tap coefficients to obtain a frequency domain response, and a third obtaining module 9013 configured to obtain the frequency domain response amplitude according to the frequency domain response.

In this embodiment, the first failure analysis unit 903 performs failure analysis according to a channel slope value determined by the first determining unit 902, and the channel slope value is a new failure analysis parameter. In this way, means of channel failure analysis increase, and channel failure analysis is more accurate. In addition, a structure of the first obtaining unit 901 is further described, which makes a structure of the device in the present disclosure more flexible.

Figure 10:
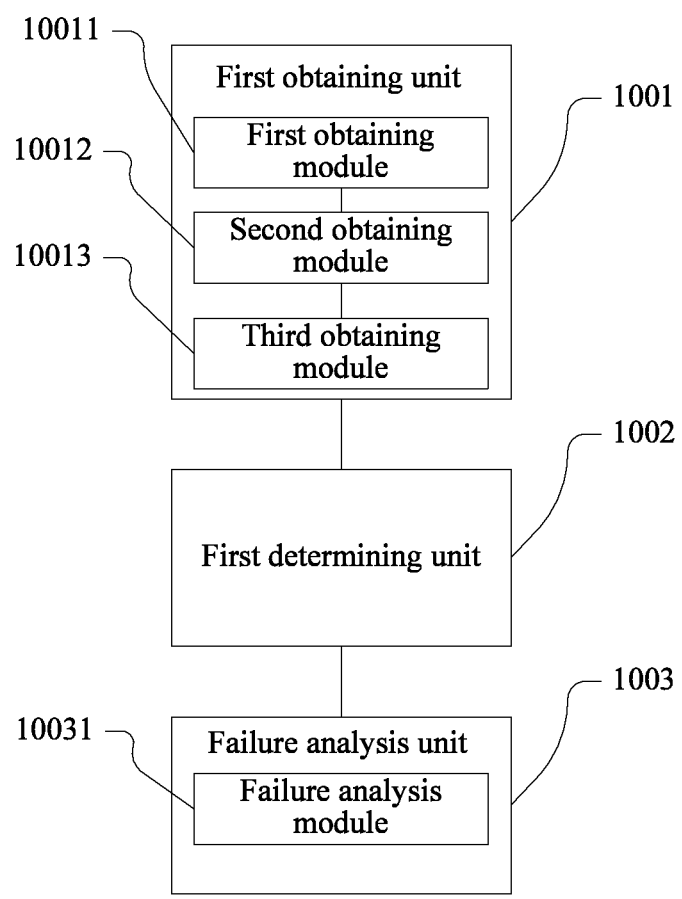
FIG. 10 is a schematic diagram of another embodiment of a failure analysis device according to the embodiments of the present disclosure.

Referring to FIG. 10, another embodiment of a failure analysis device in the embodiments of the present disclosure includes a first obtaining unit 1001 configured to obtain a frequency domain response amplitude of a channel from an HFC network, a first determining unit 1002 configured to perform linear fitting on an effective portion of the frequency domain response amplitude to determine a channel slope value, and a first failure analysis unit 1003 configured to perform channel failure analysis according to the channel slope value.

In the failure analysis device in this embodiment, the first failure analysis unit 1003 may further include a failure analysis module 10031 configured to analyze channel quality according to the channel slope value, where the channel slope value is inversely proportional to the channel quality.

It should be noted that, the first failure analysis unit 1003 may be further configured to perform other failure analysis according to the channel slope value. In actual application, the first failure analysis unit 1003 may alternatively perform channel failure analysis according to the channel slope value in another manner. For example, alternatively, comparative analysis may be performed on channel slope values of a channel for multiple different users with reference to a network topology structure in order to search for a location and a cause of a channel tilt and perform recovery. For example, it is found that channel slope values, set by an amplifier, for all users are relatively large, and it may be inferred that the relatively large slope values are caused by inappropriate adjustment of a gain slope by the amplifier. Corresponding compensation may be provided according to the channel slope values in order to return the channel slopes to zero and ensure a stable in-band frequency domain response, thereby improving signal transmission quality.

Optionally, in the failure analysis device in this embodiment, the first obtaining unit 1001 may further include a first obtaining module 10011 configured to obtain time domain tap coefficients according to pre-equalization coefficients obtained from an HFC network device, a second obtaining module 10012 configured to perform time-to-frequency conversion on the time domain tap coefficients to obtain a frequency domain response, and a third obtaining module 10013 configured to obtain the frequency domain response amplitude according to the frequency domain response.

In this embodiment, the first failure analysis unit 1003 performs failure analysis according to a channel slope value determined by the first determining unit 1002, and the channel slope value is a new failure analysis parameter. In this way, means of channel failure analysis increase, and channel failure analysis is more accurate. In addition, a structure of the first failure analysis unit 1003 is further described, which makes a structure of the device in the present disclosure more flexible.

Figure 11:
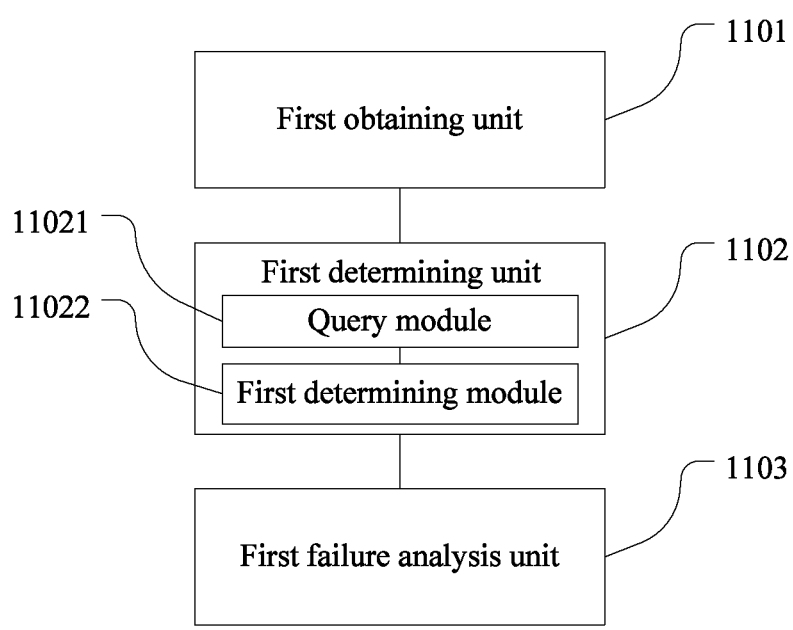
FIG. 11 is a schematic diagram of another embodiment of a failure analysis device according to the embodiments of the present disclosure.

Referring to FIG. 11, another embodiment of a failure analysis device in the embodiments of the present disclosure includes a first obtaining unit 1101 configured to obtain a frequency domain response amplitude of a channel from an HFC network, a first determining unit 1102 configured to perform linear fitting on an effective portion of the frequency domain response amplitude to determine a channel slope value, and a first failure analysis unit 1103 configured to perform channel failure analysis according to the channel slope value.

In the failure analysis device in this embodiment, the first determining unit 1102 may further include a query module 11021 configured to query, according to the effective portion of the frequency domain response amplitude, a target straight line Y=kX+b that is most similar to an amplitude curve for the effective portion of the frequency domain response amplitude and that has a smallest mean squared error value $\Sigma(FmagB-Y)^2$, where FmagB is the effective portion of the frequency domain response amplitude, and a first determining module 11022 configured to determine that the channel slope value is k.

For further descriptions of structures of the first obtaining unit 1101 and the first failure analysis unit 1103 in this embodiment, reference may also be made to the first obtaining unit 901 and 1001 and the first failure analysis unit 903 and 1003 that are described in the embodiment shown in FIG. 9 or FIG. 10, which is not limited herein.

In this embodiment, the first failure analysis unit 1103 performs failure analysis according to a channel slope value determined by the first determining unit 1102, and the channel slope value is a new failure analysis parameter. In this way, means of channel failure analysis increase, and channel failure analysis is more accurate. In addition, a structure of the first determining unit 1102 is further described, which makes a structure of the device in the present disclosure more flexible.

Figure 12:
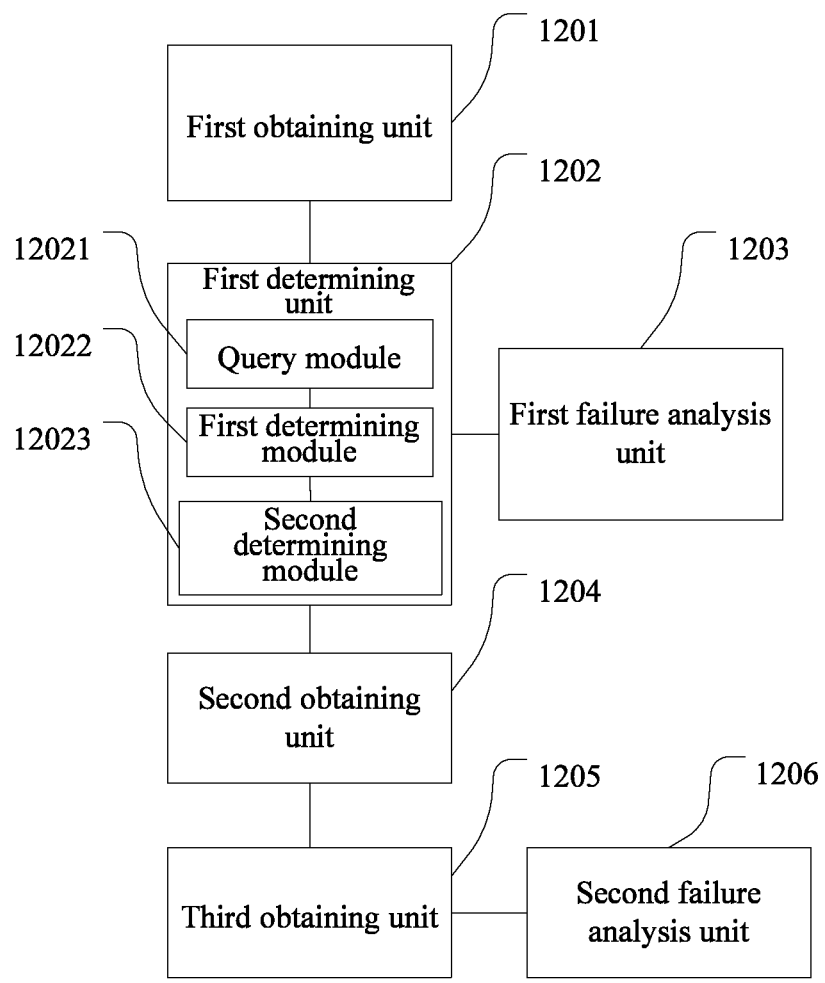
FIG. 12 is a schematic diagram of another embodiment of a failure analysis device according to the embodiments of the present disclosure.

Referring to FIG. 12, another embodiment of a failure analysis device in the embodiments of the present disclosure includes a first obtaining unit 1201 configured to obtain a frequency domain response amplitude of a channel from an HFC network, a first determining unit 1202 configured to perform linear fitting on an effective portion of the frequency domain response amplitude to determine a channel slope value, and a first failure analysis unit 1203 configured to perform channel failure analysis according to the channel slope value.

In the failure analysis device in this embodiment, the first determining unit 1202 further includes a query module 12021 configured to query, according to the effective portion of the frequency domain response amplitude, a target straight line Y=kX+b that is most similar to an amplitude curve for the effective portion of the frequency domain response amplitude and that has a smallest mean squared error value $\Sigma(FmagB-Y)^2$, where FmagB is the effective portion of the frequency domain response amplitude, and a first determining module 12022 configured to determine that the channel slope value is k.

In the failure analysis device in this embodiment, the first determining unit 1202 may further include a second determining module 12023 configured to determine that a fitting amplitude is Y.

The failure analysis device in this embodiment may further include a second obtaining unit 1204 configured to subtract the fitting amplitude from the frequency domain response amplitude to obtain a corrected effective amplitude, a third obtaining unit 1205 configured to perform interpolation on an amplitude other than the corrected effective amplitude according to the corrected effective amplitude, to obtain a corrected frequency domain response amplitude, and a second failure analysis unit 1206 configured to perform channel failure analysis according to the corrected frequency domain response amplitude.

In this embodiment, the first failure analysis unit 1203 performs failure analysis according to a channel slope value determined by the first determining unit 1202, and the channel slope value is a new failure analysis parameter. In this way, means of channel failure analysis increase, and channel failure analysis is more accurate. In addition, a structure for performing failure analysis according to a corrected frequency domain response amplitude is added, and failure analysis is more accurate.

Figure 13:
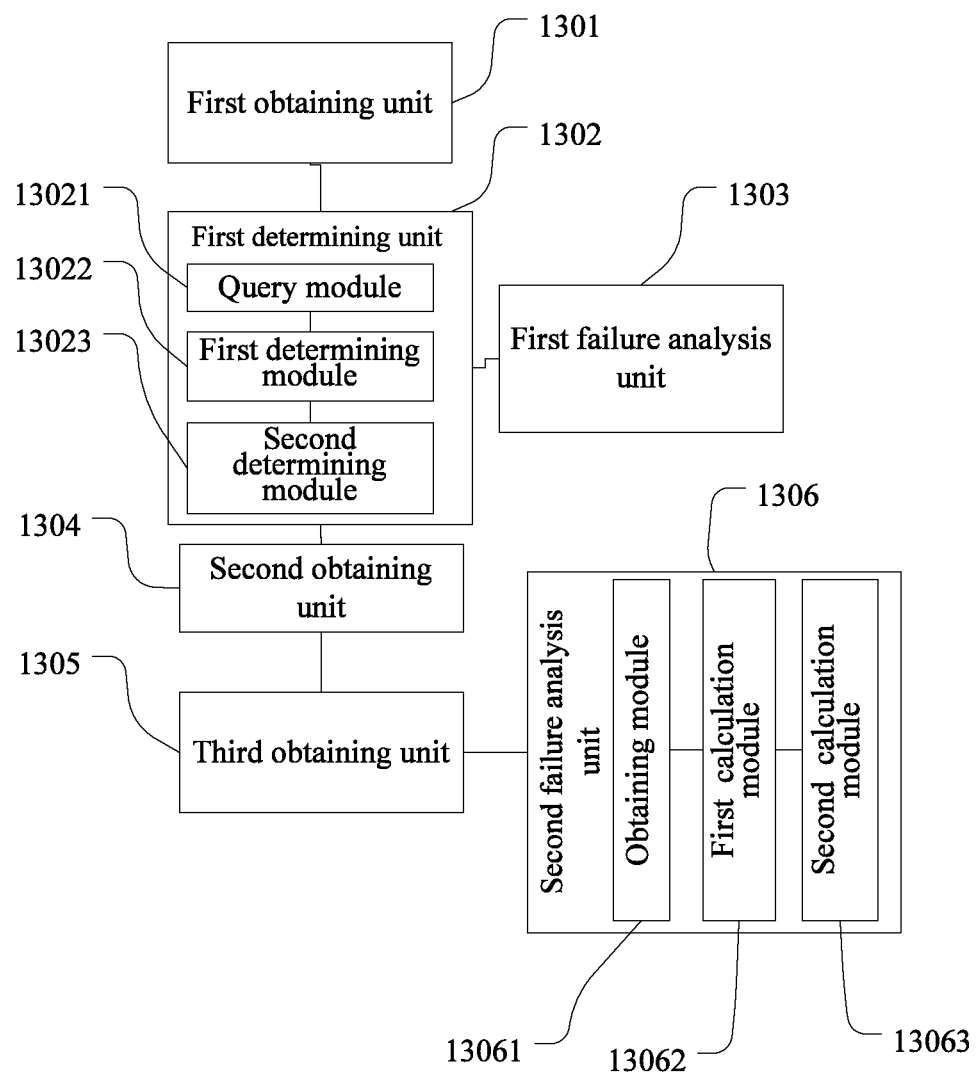
FIG. 13 is a schematic diagram of another embodiment of a failure analysis device according to the embodiments of the present disclosure.

Referring to FIG. 13, another embodiment of a failure analysis device in the embodiments of the present disclosure includes a first obtaining unit 1301 configured to obtain a frequency domain response amplitude of a channel from an HFC network, a first determining unit 1302 configured to perform linear fitting on an effective portion of the frequency domain response amplitude to determine a channel slope value, and a first failure analysis unit 1303 configured to perform channel failure analysis according to the channel slope value.

In the failure analysis device in this embodiment, the first determining unit 1302 further includes a query module 13021 configured to query, according to the effective portion of the frequency domain response amplitude, a target straight line Y=kX+b that is most similar to an amplitude curve for the effective portion of the frequency domain response amplitude and that has a smallest mean squared error value $\Sigma(FmagB-Y)^2$, where FmagB is the effective portion of the frequency domain response amplitude, and a first determining module 13022 configured to determine that the channel slope value is k.

In the failure analysis device in this embodiment, the first determining unit 1302 may further include a second determining module 13023 configured to determine that a fitting amplitude is Y.

The failure analysis device in this embodiment further includes a second obtaining unit 1304 configured to subtract the fitting amplitude from the frequency domain response amplitude to obtain a corrected effective amplitude, a third obtaining unit 1305 configured to perform interpolation on an amplitude other than the corrected effective amplitude according to the corrected effective amplitude, to obtain a corrected frequency domain response amplitude, and a second failure analysis unit 1306 configured to perform channel failure analysis according to the corrected frequency domain response amplitude.

In the failure analysis device in this embodiment, the second failure analysis unit 1306 may further include an obtaining module 13061 configured to obtain a frequency difference $\Delta f$ between two consecutive amplitude extreme points in a frequency domain response amplitude curve according to the corrected frequency domain response amplitude, where the two amplitude extreme points are two amplitude maximum points or two amplitude minimum points, a first calculation module 13062 configured to calculate a micro-reflection delay $\Delta t$ according to $\Delta t=1/\Delta f$, and a second calculation module 13063 configured to calculate a distance TDR=$\Delta t*v/2$ between two fault sources according to $\Delta t$ and a signal transmission speed v.

In this embodiment, the first failure analysis unit 1303 performs failure analysis according to a channel slope value determined by the first determining unit 1302, and the channel slope value is a new failure analysis parameter. In this way, means of channel failure analysis increase, and channel failure analysis is more accurate. In addition, a structure for performing failure analysis according to a corrected frequency domain response amplitude is added, a specific structure of the second failure analysis unit is detailed, and failure analysis is more accurate.

Figure 14:
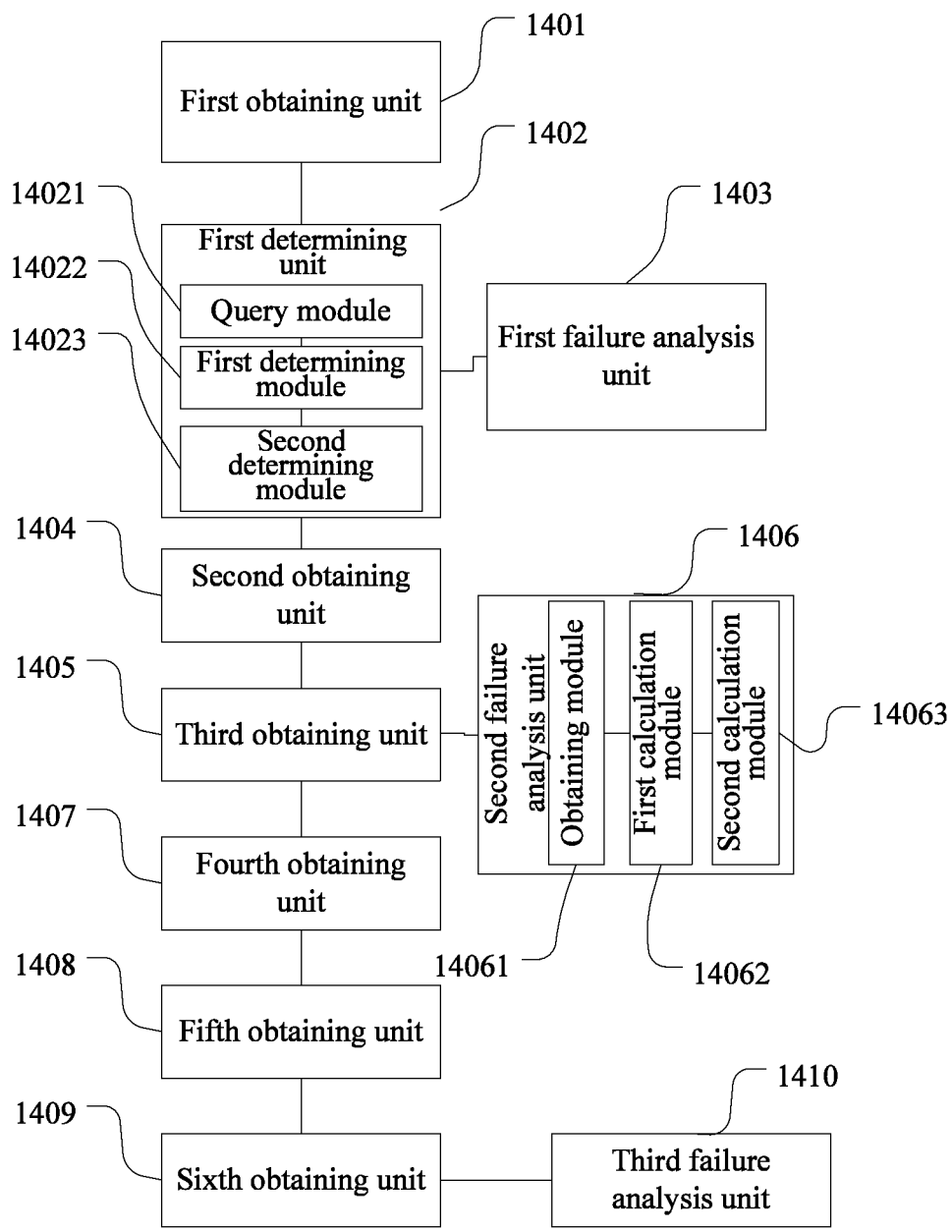
FIG. 14 is a schematic diagram of another embodiment of a failure analysis device according to the embodiments of the present disclosure.

Referring to FIG. 14, another embodiment of a failure analysis device in the embodiments of the present disclosure includes a first obtaining unit 1401 configured to obtain a frequency domain response amplitude of a channel from an HFC network, a first determining unit 1402 configured to perform linear fitting on an effective portion of the frequency domain response amplitude to determine a channel slope value, and a first failure analysis unit 1403 configured to perform channel failure analysis according to the channel slope value.

In the failure analysis device in this embodiment, the first determining unit 1402 further includes a query module 14021 configured to query, according to the effective portion of the frequency domain response amplitude, a target straight line Y=kX+b that is most similar to an amplitude curve for the effective portion of the frequency domain response amplitude and that has a smallest mean squared error value $\Sigma(FmagB-Y)^2$, where FmagB is the effective portion of the frequency domain response amplitude, and a first determining module 14022 configured to determine that the channel slope value is k.

In the failure analysis device in this embodiment, the first determining unit 1402 may further include a second determining module 14023 configured to determine that a fitting amplitude is Y.

The failure analysis device in this embodiment further includes a second obtaining unit 1404 configured to subtract the fitting amplitude from the frequency domain response amplitude to obtain a corrected effective amplitude, a third obtaining unit 1405 configured to perform interpolation on an amplitude other than the corrected effective amplitude according to the corrected effective amplitude, to obtain a corrected frequency domain response amplitude, and a second failure analysis unit 1406 configured to perform channel failure analysis according to the corrected frequency domain response amplitude.

In the failure analysis device in this embodiment, the second failure analysis unit 1406 further includes an obtaining module 14061 configured to obtain a frequency difference $\Delta f$ between two consecutive amplitude extreme points in a frequency domain response amplitude curve according to the corrected frequency domain response amplitude, where the two amplitude extreme points are two amplitude maximum points or two amplitude minimum points, a first calculation module 14062 configured to calculate a micro-reflection delay $\Delta t$ according to $\Delta t=1/\Delta f$, and a second calculation module 14063 configured to calculate a distance TDR=$\Delta t*v/2$ between two fault sources according to $\Delta t$ and a signal transmission speed v.

The failure analysis device in this embodiment may further include a fourth obtaining unit 1407 configured to obtain a frequency domain response phase according to a frequency domain response, a fifth obtaining unit 1408 configured to obtain a corrected frequency domain response according to the corrected frequency domain response amplitude and the frequency domain response phase, a sixth obtaining unit 1409 configured to perform frequency-to-time conversion on the corrected frequency domain response to obtain corrected time domain tap coefficients, and a third failure analysis unit 1410 configured to perform channel failure analysis according to the corrected time domain tap coefficients.

The third failure analysis unit 1410 may calculate, using the corrected time domain tap coefficients, one or more derived channel parameters listed in the foregoing Table 2, and perform failure analysis according to the calculated derived channel parameter. For a specific meaning and calculation method of the derived channel parameter, reference is made to the PNMP white paper.

Based on the embodiment shown in FIG. 13, in this embodiment, a corrected tap coefficient is further obtained, a structure for performing failure analysis according to corrected time domain tap coefficients is added, and channel failure analysis is more accurate.

For ease of understanding, the following describes an internal operation procedure of the failure analysis device in this embodiment using a specific application scenario as an example the first obtaining unit 1401 obtains a frequency domain response amplitude of a channel from an HFC network, the first determining unit 1402 performs linear fitting on an effective portion of the frequency domain response amplitude to determine a channel slope value, and the first failure analysis unit 1403 performs channel failure analysis according to the channel slope value.

A specific internal procedure for performing, by the first determining unit 1402, linear fitting on an effective portion of the frequency domain response amplitude to determine a channel slope value may be as follows. The query module 14021 queries, according to the effective portion of the frequency domain response amplitude, a target straight line Y=kX+b that is most similar to an amplitude curve for the effective portion of the frequency domain response amplitude and that has a smallest mean squared error value $\Sigma(FmagB-Y)^2$, where FmagB is the effective portion of the frequency domain response amplitude, and the first determining module 14022 determines that the channel slope value is k.

A procedure for obtaining a corrected frequency domain response amplitude by the failure analysis device in the present disclosure to perform failure analysis is as follows. The second determining module 14023 in the first determining unit 1402 determines that a fitting amplitude is Y. The second obtaining unit 1404 subtracts the fitting amplitude from the frequency domain response amplitude to obtain a corrected effective amplitude. The third obtaining unit 1405 performs interpolation on an amplitude other than the corrected effective amplitude according to the corrected effective amplitude, to obtain a corrected frequency domain response amplitude, and the second failure analysis unit 1406 performs channel failure analysis according to the corrected frequency domain response amplitude.

A procedure for performing channel failure analysis by the second failure analysis unit 1406 is as follows. The obtaining module 14061 obtains a frequency difference $\Delta f$ between two consecutive amplitude extreme points in a frequency domain response amplitude curve according to the corrected frequency domain response amplitude, where the two amplitude extreme points are two amplitude maximum points or two amplitude minimum points. The first calculation module 14062 calculates a micro-reflection delay $\Delta t$ according to $\Delta t=1/\Delta f$, and the second calculation module 14063 calculates a distance TDR=$\Delta t*v/2$ between two fault sources according to $\Delta t$ and a signal transmission speed v.

A procedure for obtaining corrected time domain tap coefficients by the failure analysis device in this embodiment to perform failure analysis is as follows. The fourth obtaining unit 1407 obtains a frequency domain response phase according to a frequency domain response. The fifth obtaining unit 1408 obtains a corrected frequency domain response according to the corrected frequency domain response amplitude and the frequency domain response phase. The sixth obtaining unit 1409 performs frequency-to-time conversion on the corrected frequency domain response to obtain corrected time domain tap coefficients, and the third failure analysis unit 1410 performs channel failure analysis according to the corrected time domain tap coefficients.

Figure 15:
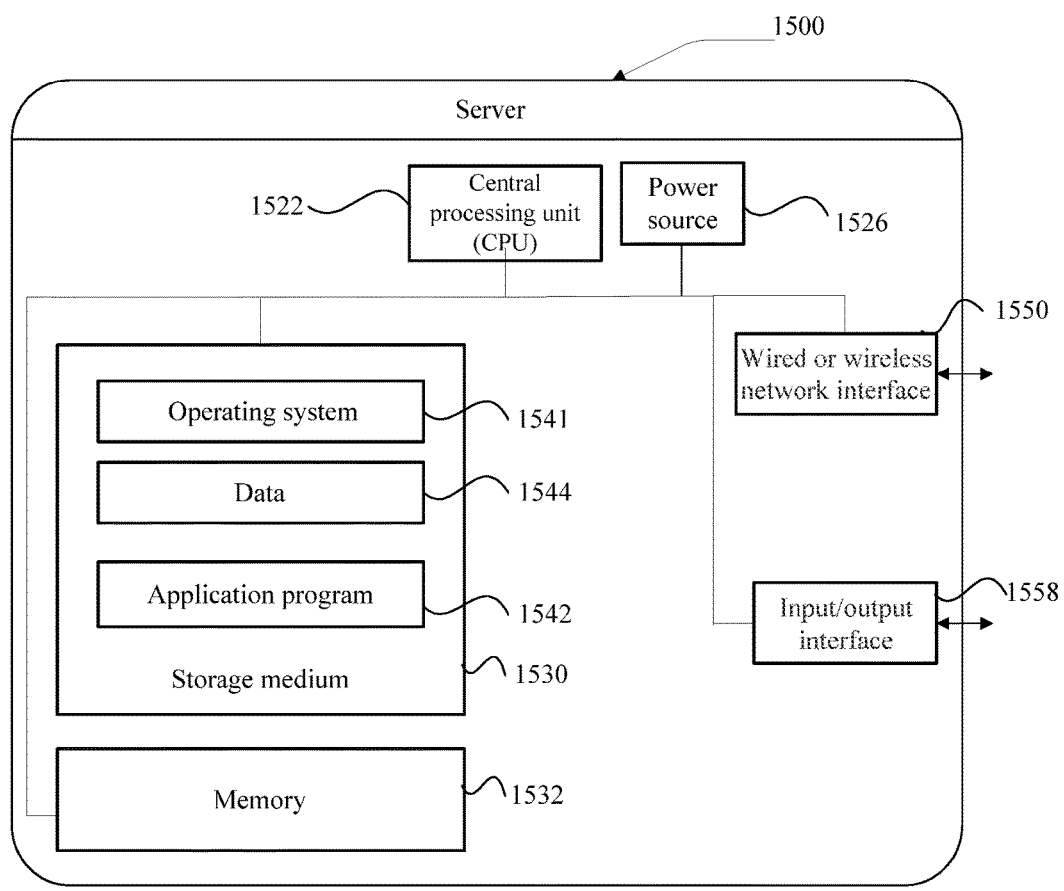
FIG. 15 is a schematic diagram a server according to the embodiments of the present disclosure.

FIG. 15 is a schematic structural diagram of a server 1500 according to an embodiment of the present disclosure. The server 1500 may vary greatly with different configurations or performance, and may include one or more central processing units (CPU) 1522 (for example, one or more processors), a memory 1532, and one or more storage medium 1530 (for example, one or more mass storage devices) that store an application program 1542 or data 1544. The memory 1532 and the storage medium 1530 may be for temporary storage or permanent storage. A program stored in the storage medium 1530 may include one or more modules (not shown in the figure), where each module may include a series of instruction operations for the server. Further, the CPU 1522 may be configured to perform communication with the storage medium 1530, and execute, on the server 1500, the series of instruction operations in the storage medium 1530.

The server 1500 may further include one or more power sources 1526, one or more wired or wireless network interfaces 1550, one or more input/output interfaces 1558, and/or one or more operating systems 1541, such as WINDOWS SERVER®, MAC OS™ UNIX™ LINUX™, or FREEBSD™.

The steps executed by the failure analysis device in the foregoing embodiments may be based on the structure of the server shown in FIG. 15.

It may be clearly understood by persons skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present disclosure. The foregoing storage medium includes any medium that can store program code, such as a universal serial bus (USB) flash drive, a removable hard disk, a read-only memory (ROM), a random access memory (RAM), a magnetic disk, or an optical disc.

The foregoing embodiments are merely intended to describe the technical solutions of the present disclosure, but not to limit the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A failure analysis method, comprising:
    obtaining a frequency domain response amplitude of a channel from a hybrid fiber-coaxial (HFC) network, the frequency domain response amplitude of the channel comprising an amplitude-frequency curve of a plurality of subcarrier frequencies of the HFC network and a plurality of amplitude values corresponding to the plurality of subcarrier frequencies;
    performing linear fitting on an effective portion of the frequency domain response amplitude to acquire a channel slope value; and
    performing channel failure analysis according to the channel slope value.

2. The method according to claim 1, wherein obtaining the frequency domain response amplitude comprises:
    obtaining time domain tap coefficients according to pre-equalization coefficients obtained from an HFC network device;
    performing time-to-frequency conversion on the time domain tap coefficients to obtain a frequency domain response; and
    obtaining the frequency domain response amplitude according to the frequency domain response.

3. The method according to claim 1, wherein performing the channel failure analysis comprises analyzing channel quality according to the channel slope value, wherein the channel slope value is inversely proportional to the channel quality.

4. The method according to claim 1, wherein performing the linear fitting on the effective portion of the frequency domain response amplitude comprises:

querying, according to the effective portion of the frequency domain response amplitude, a target straight line, wherein an equation of the target straight line comprises Y=kX+b and is most similar to an amplitude curve of the effective portion of the frequency domain response amplitude and comprises a smallest mean squared error value ($\Sigma(FmagB-Y)^2$), and wherein FmagB is the effective portion of the frequency domain response amplitude; and acquiring that the channel slope value is k.

5. The method according to claim 4, wherein after performing the linear fitting on the effective portion of the frequency domain response amplitude, the method further comprises:

acquiring that a fitting amplitude is Y;

subtracting the Y from the frequency domain response amplitude to obtain a corrected effective amplitude;

performing interpolation on an amplitude other than the corrected effective amplitude according to the corrected effective amplitude, to obtain a corrected frequency domain response amplitude; and performing the channel failure analysis according to the corrected frequency domain response amplitude.

6. The method according to claim 5, wherein performing the channel failure analysis comprises:

obtaining a frequency difference ($\Delta f$) between two consecutive amplitude extreme points in a frequency domain response amplitude curve according to the corrected frequency domain response amplitude, wherein the two amplitude extreme points are two amplitude maximum points;

calculating a micro-reflection delay ($\Delta t$) according to $\Delta t=1/\Delta f$; and calculating a distance between two fault sources (TDR) according to the $\Delta t$ and a signal transmission speed (v), wherein the TDR=$\Delta t*v/2$.

7. The method according to claim 5, wherein performing the channel failure analysis comprises:

obtaining a frequency difference ($\Delta f$) between two consecutive amplitude extreme points in a frequency domain response amplitude curve according to the corrected frequency domain response amplitude, wherein the two amplitude extreme points are two amplitude minimum points;

calculating a micro-reflection delay ($\Delta t$) according to $\Delta t=1/\Delta f$; and calculating a distance between two fault sources (TDR) according to the $\Delta t$ and a signal transmission speed (v), wherein the TDR=$\Delta t*v/2$.

8. The method according to claim 5, further comprising:

obtaining a frequency domain response phase according to a frequency domain response;

obtaining a corrected frequency domain response according to the corrected frequency domain response amplitude and the frequency domain response phase;

performing frequency-to-time conversion on the corrected frequency domain response to obtain corrected time domain tap coefficients; and performing the channel failure analysis according to the corrected time domain tap coefficients.

9. A failure analysis device, comprising:

a memory; and a processor coupled to the memory and configured to:

obtain a frequency domain response amplitude of a channel from a hybrid fiber-coaxial (HFC) network, the frequency domain response amplitude of the channel comprising an amplitude-frequency curve of a plurality of subcarrier frequencies of the HFC network and a plurality of amplitude values corresponding to the plurality of subcarrier frequencies;

perform linear fitting on an effective portion of the frequency domain response amplitude to acquire a channel slope value; and perform channel failure analysis according to the channel slope value.

10. The device according to claim 9, wherein the processor is further configured to:

obtain time domain tap coefficients according to pre-equalization coefficients obtained from an HFC network device;

perform time-to-frequency conversion on the time domain tap coefficients to obtain a frequency domain response; and obtain the frequency domain response amplitude according to the frequency domain response.

11. The device according to claim 9, wherein the processor is further configured to analyze channel quality according to the channel slope value, wherein the channel slope value is inversely proportional to the channel quality.

12. The device according to claim 9, wherein the processor is further configured to:

query, according to the effective portion of the frequency domain response amplitude, a target straight line, wherein an equation of the target straight line comprises Y=kX+b and is most similar to an amplitude curve of the effective portion of the frequency domain response amplitude and comprises a smallest mean squared error value ($\Sigma(FmagB-Y)^2$), and wherein FmagB is the effective portion of the frequency domain response amplitude; and acquire that the channel slope value is k.

13. The device according to claim 12, wherein the processor is further configured to:

acquire that a fitting amplitude is Y;

subtract the Y from the frequency domain response amplitude to obtain a corrected effective amplitude;

perform interpolation on an amplitude other than the corrected effective amplitude according to the corrected effective amplitude, to obtain a corrected frequency domain response amplitude; and perform the channel failure analysis according to the corrected frequency domain response amplitude.

14. The device according to claim 13, wherein the processor is further configured to:

obtain a frequency difference ($\Delta f$) between two consecutive amplitude extreme points in a frequency domain response amplitude curve according to the corrected frequency domain response amplitude, wherein the two amplitude extreme points are two amplitude maximum points;

calculate a micro-reflection delay ($\Delta t$) according to $\Delta t=1/\Delta f$; and calculate a distance between two fault sources (TDR) according to the $\Delta t$ and a signal transmission speed (v), wherein TDR=$\Delta t*v/2$.

15. The device according to claim 13, wherein the processor is further configured to:

obtain a frequency difference ($\Delta f$) between two consecutive amplitude extreme points in a frequency domain response amplitude curve according to the corrected frequency domain response amplitude, wherein the two amplitude extreme points are two amplitude minimum points;

calculate a micro-reflection delay ($\Delta t$) according to $\Delta t=1/\Delta f$; and calculate a distance between two fault sources (TDR) according to the $\Delta t$ and a signal transmission speed (v), wherein TDR=$\Delta t*v/2$.

16. The device according to claim 13, wherein the processor is further configured to:

obtain a frequency domain response phase according to a frequency domain response;

obtain a corrected frequency domain response according to the corrected frequency domain response amplitude and the frequency domain response phase;

perform frequency-to-time conversion on the corrected frequency domain response to obtain corrected time domain tap coefficients; and perform the channel failure analysis according to the corrected time domain tap coefficients.

17. A non-transitory computer readable medium configured to store a computer program product comprising computer executable instructions that when executed by a processor of a failure analysis device cause the processor to:

obtain a frequency domain response amplitude of a channel from a hybrid fiber-coaxial (HFC) network, the frequency domain response amplitude of the channel comprising an amplitude-frequency curve of a plurality of subcarrier frequencies of the HFC network and a plurality of amplitude values corresponding to the plurality of subcarrier frequencies;

perform linear fitting on an effective portion of the frequency domain response amplitude to acquire a channel slope value; and perform channel failure analysis according to the channel slope value.

18. The non-transitory computer readable medium of claim 17, wherein the computer executable instructions, when executed by the processor of the failure analysis device, further cause the processor to query, according to the effective portion of the frequency domain response amplitude, a target straight line.

19. The non-transitory computer readable medium of claim 17, wherein the computer executable instructions, when executed by the processor of the failure analysis device, further cause the processor to analyze channel quality according to the channel slope value, wherein the channel slope value is inversely proportional to the channel quality.

20. The non-transitory computer readable medium of claim 17, wherein the computer executable instructions, when executed by the processor of the failure analysis device, further cause the processor to:

obtain time domain tap coefficients according to pre-equalization coefficients obtained from an HFC network device;

perform time-to-frequency conversion on the time domain tap coefficients to obtain a frequency domain response; and obtain the frequency domain response amplitude according to the frequency domain response.

* * * * *